US 6,633,281 B2

(12) United States Patent
Lin et al.

(10) Patent No.: US 6,633,281 B2
(45) Date of Patent: Oct. 14, 2003

(54) INTELLIGENT TOUCH-TYPE UNIVERSAL REMOTE CONTROL

(75) Inventors: Chih-Shu Lin, Taipei (TW); Yu-Wu Fan, Tucheng (TW); Chia-Hui Wang, Sanchung (TW); Chun-Kai Yang, Taipei (TW); Wei-Chung Hsu, Panchiao (TW); Cheng-Wen Hsiao, Chungho (TW)

(73) Assignee: Sun Wave Technology Corp., Taipei (TW)

( * ) Notice: Subject to any disclaimer, the term of this patent is extended or adjusted under 35 U.S.C. 154(b) by 249 days.

(21) Appl. No.: 09/731,731

(22) Filed: Dec. 8, 2000

(65) Prior Publication Data

US 2001/0017615 A1 Aug. 30, 2001

(30) Foreign Application Priority Data

Dec. 10, 1999 (TW) ........................................ 88121654 A

(51) Int. Cl.[7] .............................. G09G 5/08; G09G 5/00
(52) U.S. Cl. ...................... 345/173; 345/168; 345/172; 345/158
(58) Field of Search .................................. 345/168, 169, 345/172, 173, 158; 348/734

(56) References Cited

U.S. PATENT DOCUMENTS 5,691,710 A * 11/1997 Pietraszak et al. ..... 340/825.72
6,130,726 A * 10/2000 Darbee et al. .............. 348/734
6,208,341 B1 * 3/2001 van Ee et al. .............. 345/716

* cited by examiner

*Primary Examiner*—Richard Hjerpe
*Assistant Examiner*—Duc Q Dinh
(74) *Attorney, Agent, or Firm*—Bacon & Thomas, PLLC

(57) ABSTRACT

An intelligent touch-type universal remote control has a touch-type screen, an infrared transmitter for transmitting remote control codes, an infrared receiver for receiving remote control codes to perform a learning procedure, a basic button set, and a processing unit. The touch-type screen can be activated by operating the basic button set to display a main menu page having a macro button, a previous page button, a next page button, and multiple items, each further corresponding to at least one menu page, for corresponding to various appliances to be controlled, each button being selected simply by touching. The touch-type screen can also be activated by operating the basic button set to display a setting menu screen for setting the universal remote control.

14 Claims, 30 Drawing Sheets

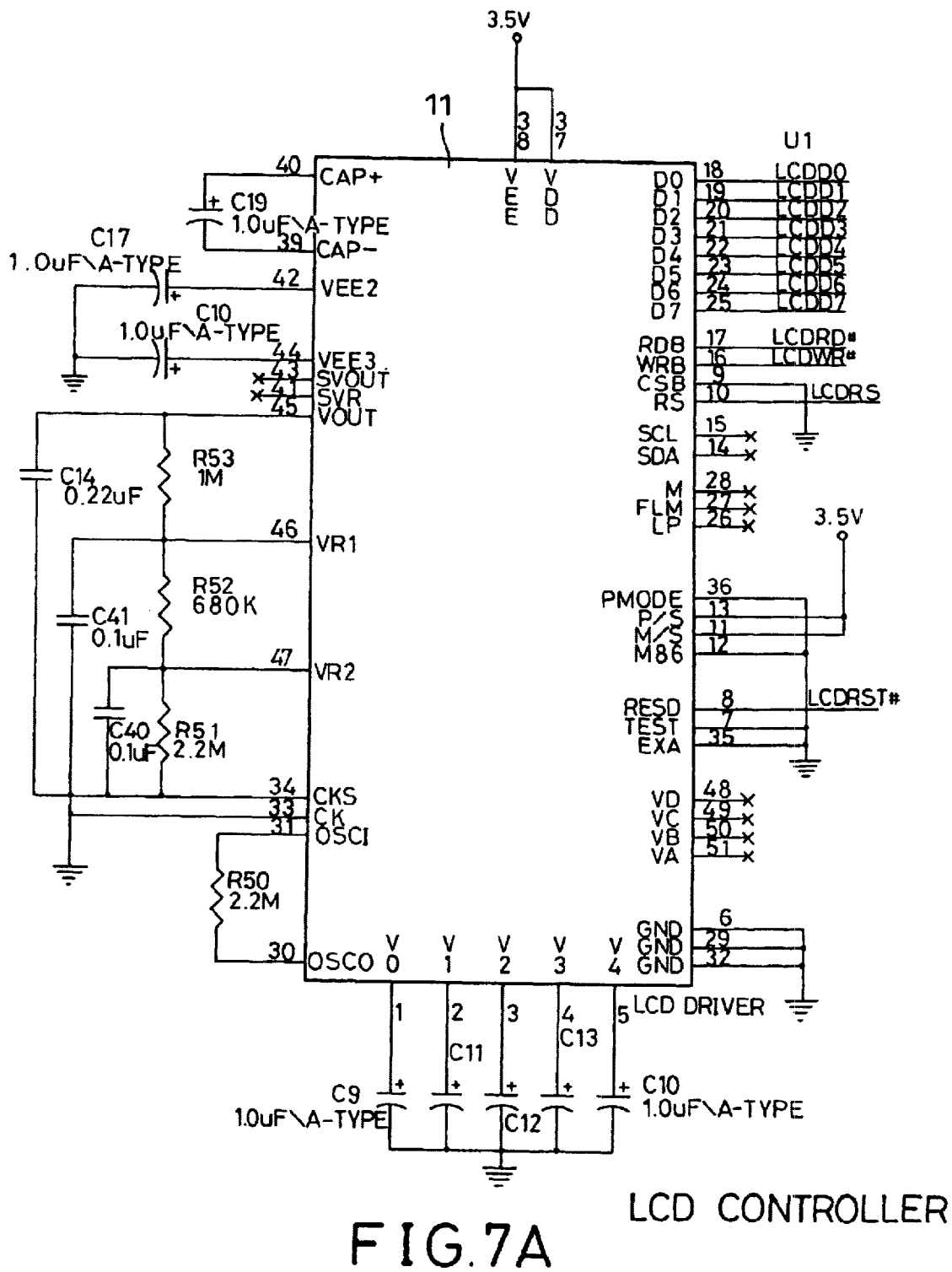
FIG.7A LCD CONTROLLER

INTELLIGENT TOUCH-TYPE UNIVERSAL REMOTE CONTROL

BACKGROUND OF THE INVENTION

1. Field of the Invention

The present invention relates to a universal remote control and, more particularly, to an intelligent touch-type universal remote control that is user-friendly to operate.

2. Description of Related Art

Currently, many household appliances are operated by remote controls so as to make the operation of the household appliances more convenient. However, because each electrical appliance is provided with its own remote control, the use of respective remote controls becomes inconvenient if the quantity of electrical appliances is relatively large. For example, the user may use an incorrect remote control to try to operate an electrical appliance since the remote controls are so similar in appearance.

To overcome such an inconvenience a universal remote control is provided for operating the user's respective household appliances. Although, the use of the universal remote control does make the control of the electrical appliances easier, it is still not satisfactory. For example, there are too many buttons on a universal remote control for controlling various kinds of electrical appliances. The user must be very careful in pressing a correct one among so many buttons for performing a desired operation. Besides, because lots of buttons have to be arranged on the universal remote control, the dimension of each button is made as small as possible and the user has to pay a lot of attention to avoid pressing a wrong button.

Furthermore, the use of conventional universal remote control in a learning mode is not convenient enough. It is known that the universal remote control is able to have the control function of the original remote control after performing a learning procedure in a learning mode. Generally, there are two kinds of learning mode available for performing the learning procedure. The first one is accomplished by one button to one button learning. That is, the user has to continuously press a specific button of the universal remote control, and simultaneously press a corresponding button of the original remote control, so that the remote control code from the original remote control can be learned to correspond to the specific button of the universal remote control. Such a learning procedure is not convenient or user-friendly as the user has to operate the universal remote control and the original one using both hands.

The second kind of learning mode is accomplished by automatically searching the default remote control codes in the universal remote control, and this learning mode is further divided into an automatic mode and a manual mode. In using the automatic mode to perform the learning procedure, the user must hold the universal remote control to face the controlled appliance and press a button to be programmed and the universal remote control will automatically transmit remote control codes of different manufacturers' appliances sequentially until a remote control code is matched. As such, the user can test the matched one, and if the test is successful, set the button to transmit the matched code. However, because the quantity of remote control codes built in the universal remote control may be as many as 200 to 300, the user generally needs to wait for about 5 to 20 minutes to program a button, and if the user fails to take notice of a code being matched, the whole learning procedure must be repeated again. Therefore, the operation of such a learning mode is deemed too complicated.

As to the manual mode, the user has to repeatedly press a power on button of the universal remote control for transmitting remote control codes of different manufacturers' appliances until a remote control code is matched. Therefore, if there are 200–300 codes built in the universal remote control, the user may need to press the power on button 200–300 times for programming the button. Accordingly, this operation is even more inconvenient than the other examples given earlier.

Moreover, the conventional remote control may be provided with a macro function for executing a series of operations, generally initiated by pressing a plurality of buttons, by simply pressing a macro button. Such a macro function is particularly useful in operating audio and video systems, which usually needs to perform a series of operations to accomplish a user's demand. For example, if a user wants to watch the program of a video tape, the user has to perform the following operations: (1) powering on the TV, (2) selecting the channel for the VCR, (3) powering on the VCR, and (4) pressing the play button of the VCR. Furthermore, if the user also wants to adjust the volume or turn on an amplifier, there are even more operations to be followed. Therefore, the use of the macro function to perform all the above operations by only pressing one button does greatly enhance the convenience in using the universal remote control. However, in practical application, such a macro function sometimes does not work due to the fact that, although the universal remote control has transmitted all remote control codes after the macro button has been pressed, some of the electrical appliances, which are just powered on by the power-on remote control codes, may not properly receive the other remote control codes. Accordingly, the user is unable to use the macro function to conveniently control the electrical appliances.

In addition cable TV is getting increasingly popular and there are generally dozens of channels provided to satisfy the requirements of the viewers. As the number of channels available gets larger, the selection of a desired channel among those channels becomes inconvenient. Although most of the cable TV companies have already put the channels of the same type as close as possible to each other the viewer usually has certain favorites which may not correspond to the provided groupings, thus resulting in dissatisfaction. Therefore, there is a desire to have a novel universal remote control to mitigate and/or obviate the aforementioned problems.

SUMMARY OF THE INVENTION

The object of the present invention is to provide an intelligent touch-type universal remote control that is user-friendly to operate.

To achieve the object, the intelligent touch-type universal remote control of the present invention includes; a body; a touch-type screen arranged on the body; an infrared transmitter arranged on a predefined position of the body for transmitting remote control codes; an infrared receiver arranged on a predefined position of the body for receiving remote control codes to perform a learning procedure; a basic button set arranged on the body; and a processing unit arranged in the body. The processing unit has a microprocessor and a memory unit. The microprocessor is connected to the touch-type screen, infrared transmitter, infrared receiver and basic button set. The memory unit is provided to store default remote control codes and control commands. The touch-type screen can be activated by operating the basic button set to display a main menu page having a macro button, a previous page button, a next page button, and multiple items, each further corresponding to at least one menu page, for corresponding to various appliances to be controlled, each button being selected simply by touching. The touch-type screen can also be activated by operating the basic button set to display a setting menu screen for setting the universal remote control.

Other objects, advantages, and novel features of the invention will become more apparent from the following detailed description when taken in conjunction with the accompanying drawings.

BRIEF DESCRIPTION OF THE DRAWINGS

FIGS. 7A–7I show a circuit diagram of a processing unit in the intelligent touch-type universal remote control in accordance with the present invention;

DETAILED DESCRIPTION OF THE PREFERRED EMBODIMENT

Figure 1:
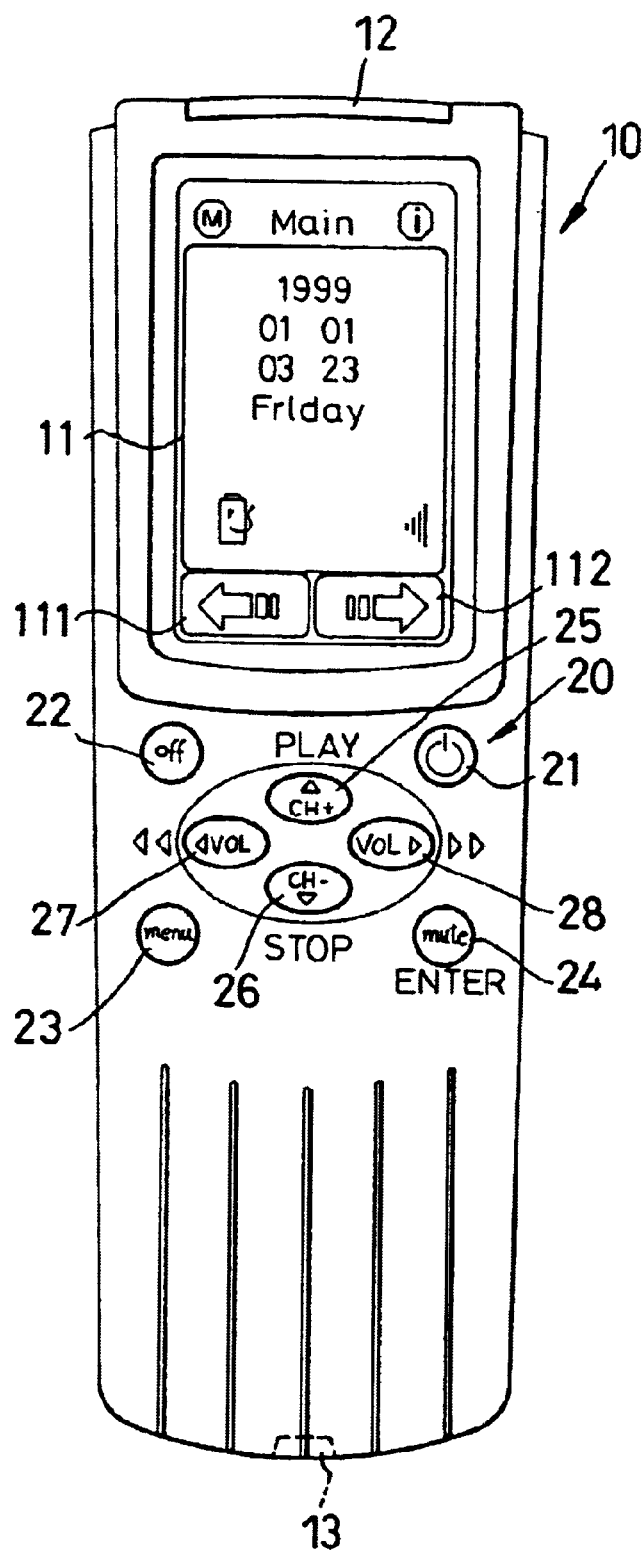
FIG. 1 is a plain view showing a preferred embodiment of the intelligent touch-type universal remote control in accordance with the present invention.

With reference to the figures and in particular FIG. 1, there is shown an intelligent touch-type universal remote control in accordance with a preferred embodiment of the present invention, which includes a body 10, a touch-type screen 11 on the body 10, an infrared transmitter 12 arranged on a predefined position of the body 10 for transmitting remote control codes, an infrared receiver 13 arranged at a predefined position of the body 10 for receiving remote control codes to perform a learning procedure, a basic button set 20 on the body 10, and a processing unit (not shown) in the body 10.

Figure 2:
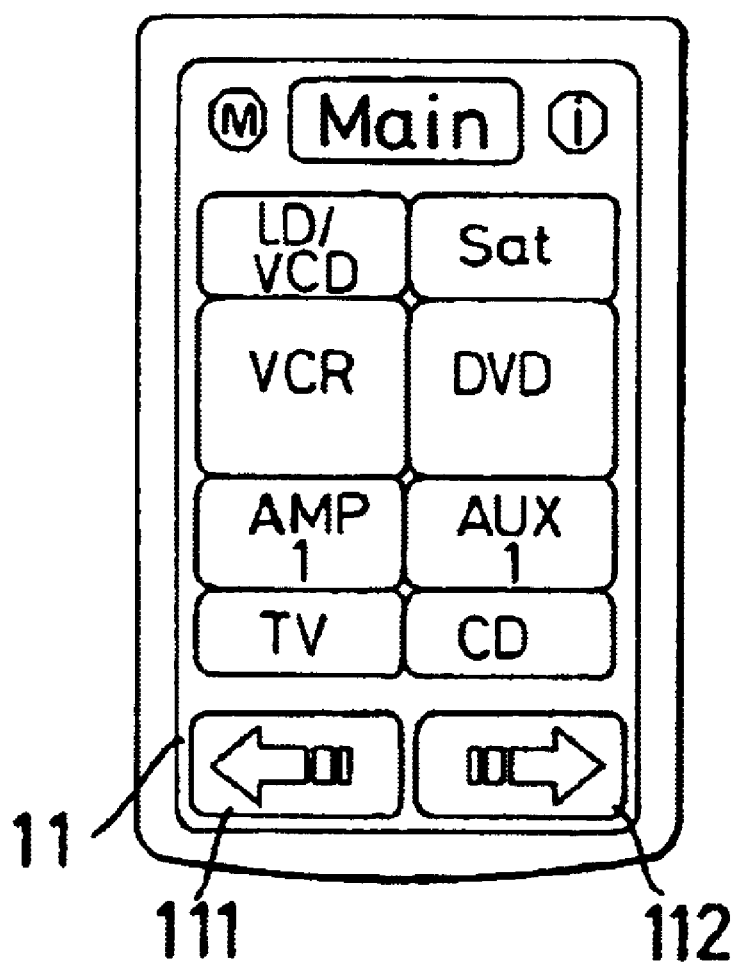
FIG. 2 schematically illustrates a main menu of the intelligent touch-type universal remote control in accordance with the present invention.

The touch-type screen 11 can be activated to display a main menu page by operating the basic button set 20, as shown in FIG. 2. The main menu page provides a macro button (M), an information button (i), a previous page button 111, a next page button 112, and multiple items for corresponding to various appliances to be controlled. Each of the buttons can be selected simply by touching thereon.

The appliances to be controlled can be any kinds of electrical appliances. In this preferred embodiment, the appliances to be controlled shown on the main menu are a TV, an LD/VCD player, a DVD player, a VCR, an amplifier (AMP), a CD player, and other electrical appliances that can be remotely controlled.

Figure 3:
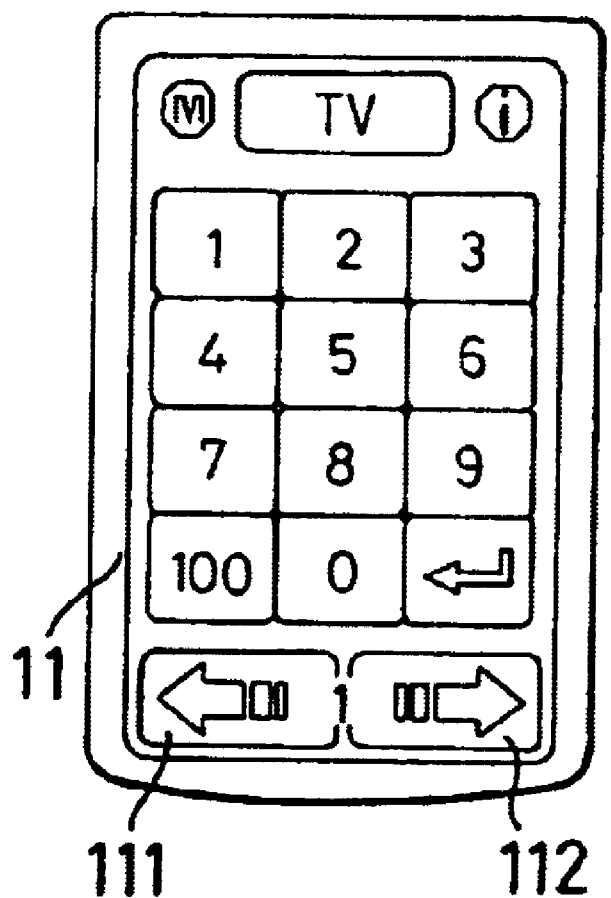
FIG. 3 schematically illustrates a menu for a TV item present on a touch-type screen in accordance with the present invention.

When each touch-type item is pressed, the menu corresponding to the pressed item is entered. For example, when the TV item is pressed, the touch-type screen 11 is switched to display the menu for controlling the TV. FIG. 3 shows the first page of the menu for controlling the IV which is a screen arranged with a set of keys. By touching the keys, the desired TV channels can be selected. It is noted that the previous page button 111 and the next page button 112 at the lower portion of the screen are provided for the user to change the displayed page, and thus they remain unchanged when the screen is changed. Taking the selection of a TV channel as an example, the first page is provided for channel select, and the subsequent pages may be provided for other purposes, such as CATV/TV select, TV/VIDEO select, timer setting, volume control, color adjustment and hot keys programming.

Furthermore, it is preferred to have a channel classification function in the TV item for managing the CATV channels, so as to gather the channels of the same type together for being controlled by a specific button. Therefore, when the specific button is selected to perform channel selection, the TV program is switched only among those channels of the corresponding type instead of all the channels. The procedure to program the channel classification function will be described hereinafter.

From the operation of the TV item, it is known that a menu for controlling a specific electrical appliance will be present when an item in the main menu displayed on the touch-type screen 11 is selected. By further changing the displayed page on the screen, the user is able to remotely control the appliance by using only the one touch-type screen 11.

Figure 4:
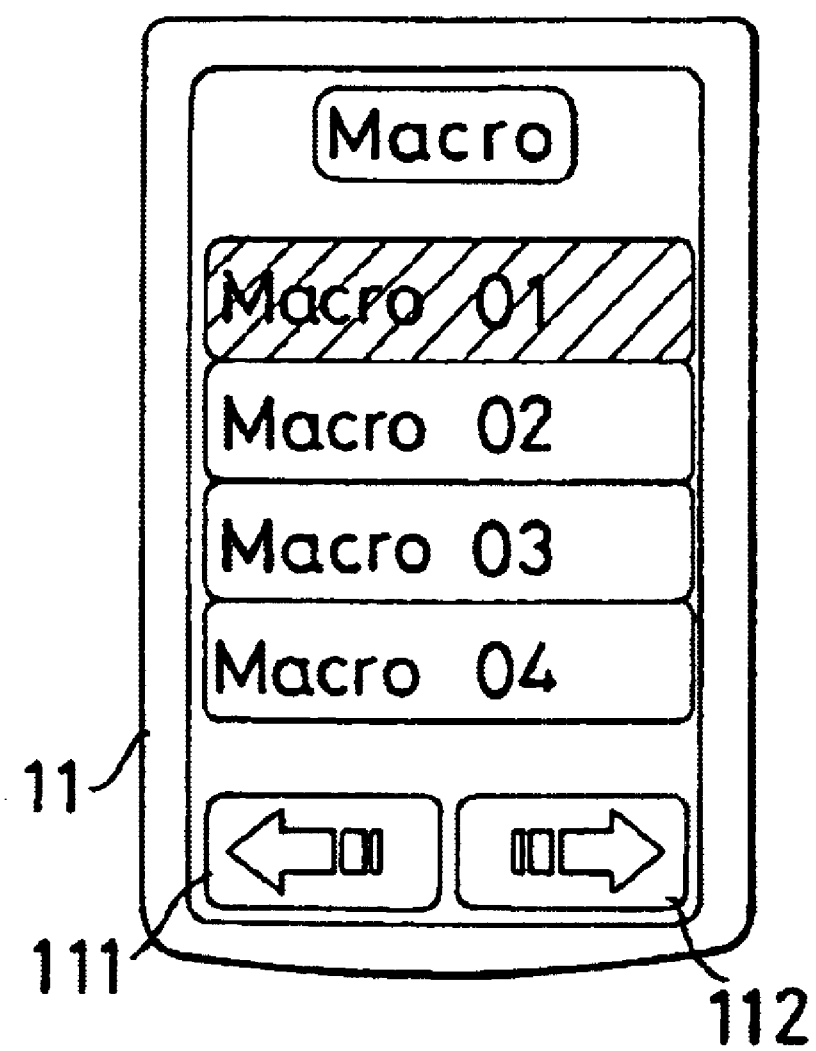
FIG. 4 schematically illustrates a menu for a macro button present on the touch-type screen in accordance with the present invention.
Figure 13:
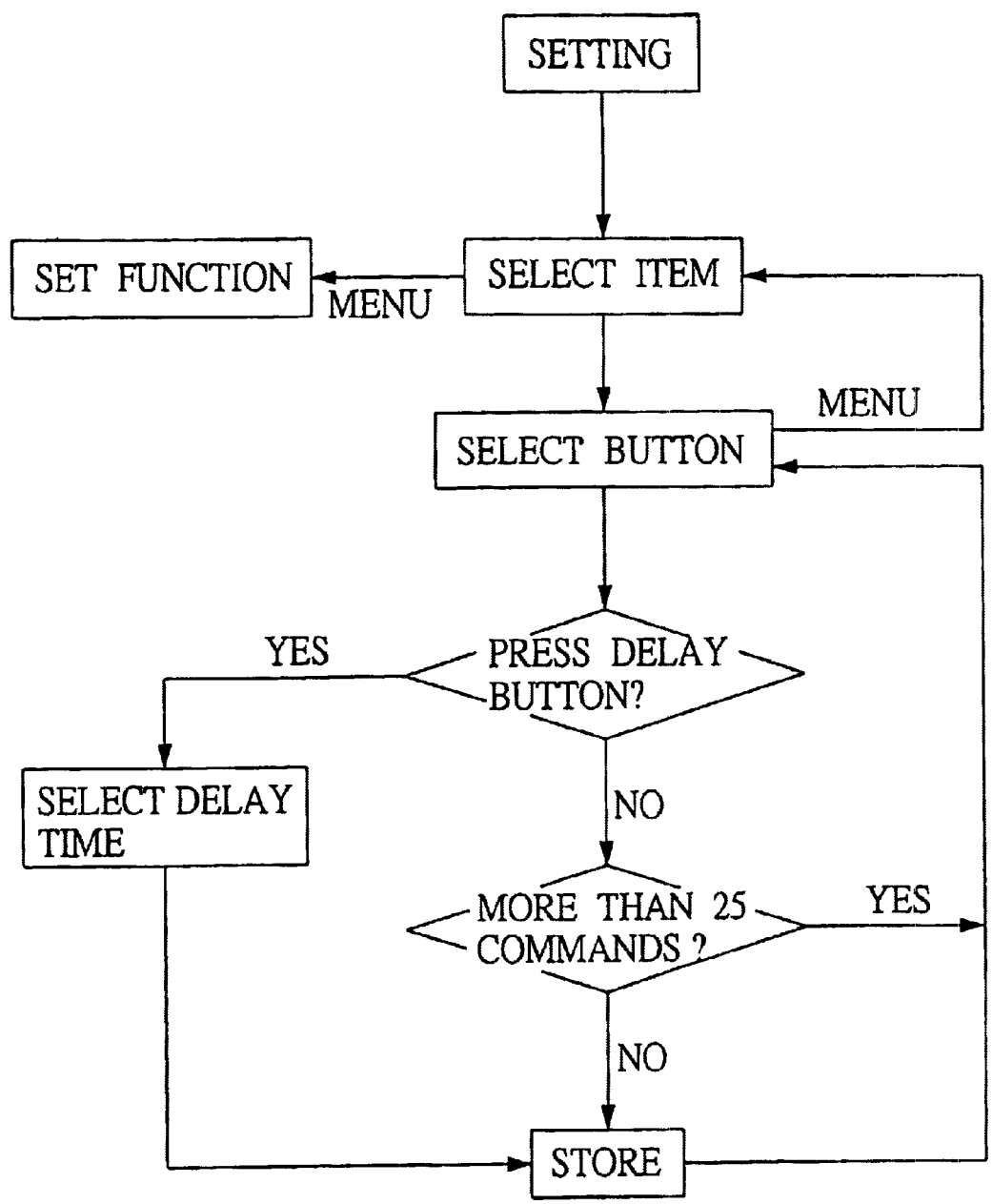
FIG. 13 is a flow chart to set the duration of a delay between transmitting two remote control codes by using a macro key in accordance with the present invention.

As to the macro button (M), it is a hot key to provide the macro function. When the macro button (M) is touched, a macro menu is selected, as shown in FIG. 4, which presents multiple macro keys. The macro menu may have several pages for providing a plurality of macro keys. By operating the previous page button 111 and the next page button 112, a desired page can be selected. An appropriate macro key in the page of the macro menu can be touched to execute a series of operations corresponding to multiple buttons almost simultaneously. However, the remote control codes corresponding to the buttons defined in a macro key are not transmitted at the same time. On the contrary, the remote control codes are sequentially transmitted and a delay is inserted between two of them, such that some electrical appliances can be properly powered on before receiving another remote code. The duration of delay can be programmed by the user. A detailed procedure to set the duration of the delay is given in FIG. 13.

Figure 5:
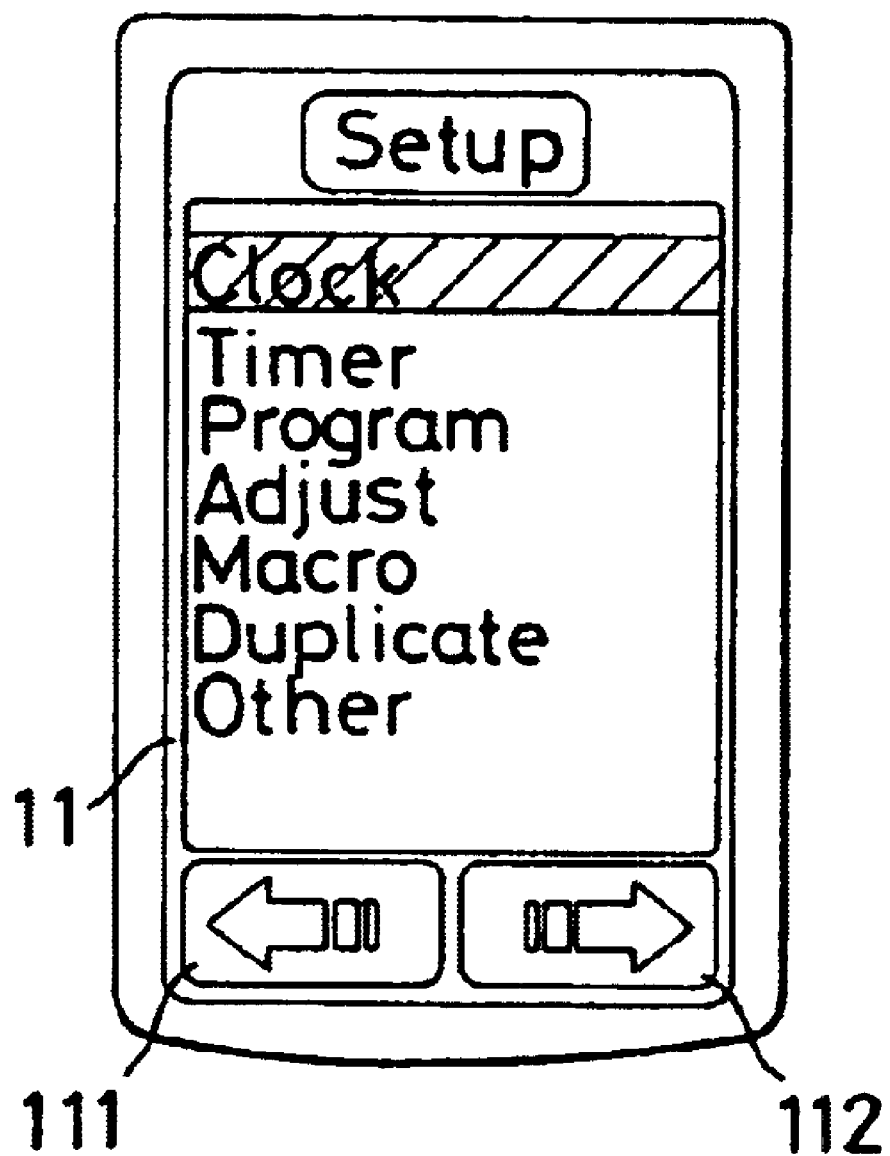
FIG. 5 schematically illustrates a setting menu present on the touch-type screen in accordance with the present invention.

With reference to FIG. 1 again, the basic button set 20 includes a power on button 21, a power off button 22, a menu/setting button 23, a mute/enter button 24, a channel-up/play button 25, a channel-down/stop button 26, a volume/backward button 27, and a volume/forward button 28. In addition to activating the touch-type screen 11 to display the main menu, the menu/setting button 23 can be used to provide a setting function. A screen of a setting menu, as shown in FIG. 5, is displayed on the touch-type screen 11 when the menu/setting button 23 is pressed continuously for several seconds. The items to be set in the setting menu includes the 'clock', 'timer', 'program', 'adjust', 'macro', and 'duplicate', etc. These items can be selected by using the channel-up/play button 25, channel-down/stop button 26, and then confirmed by using the mute/enter button 24. Furthermore, each item has its own menu for performing a desired setting.

Figure 6:
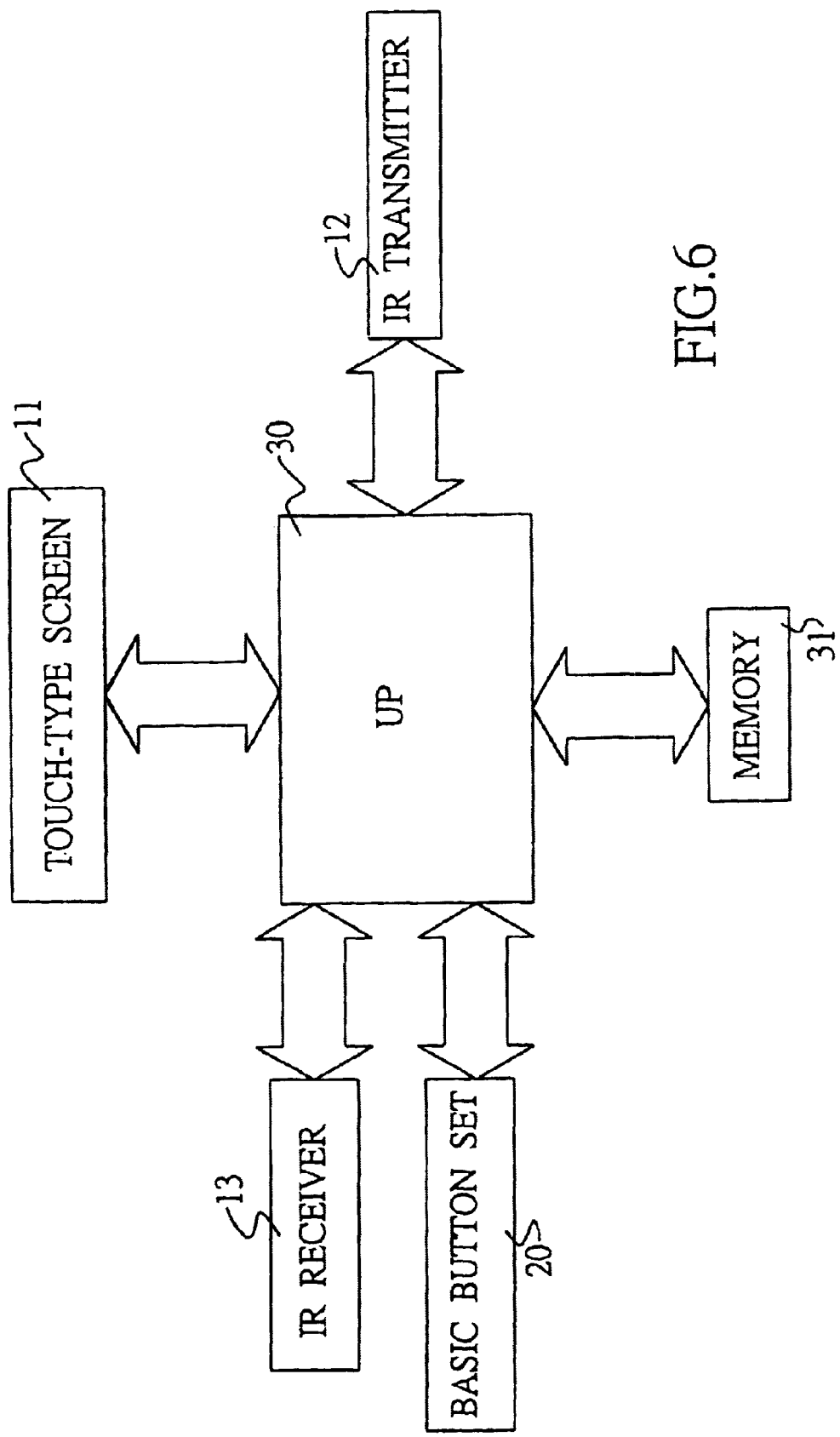
FIG. 6 is a functional block diagram of the processing unit in the intelligent touch-type universal remote control in accordance with the present invention.
Figure 7B:
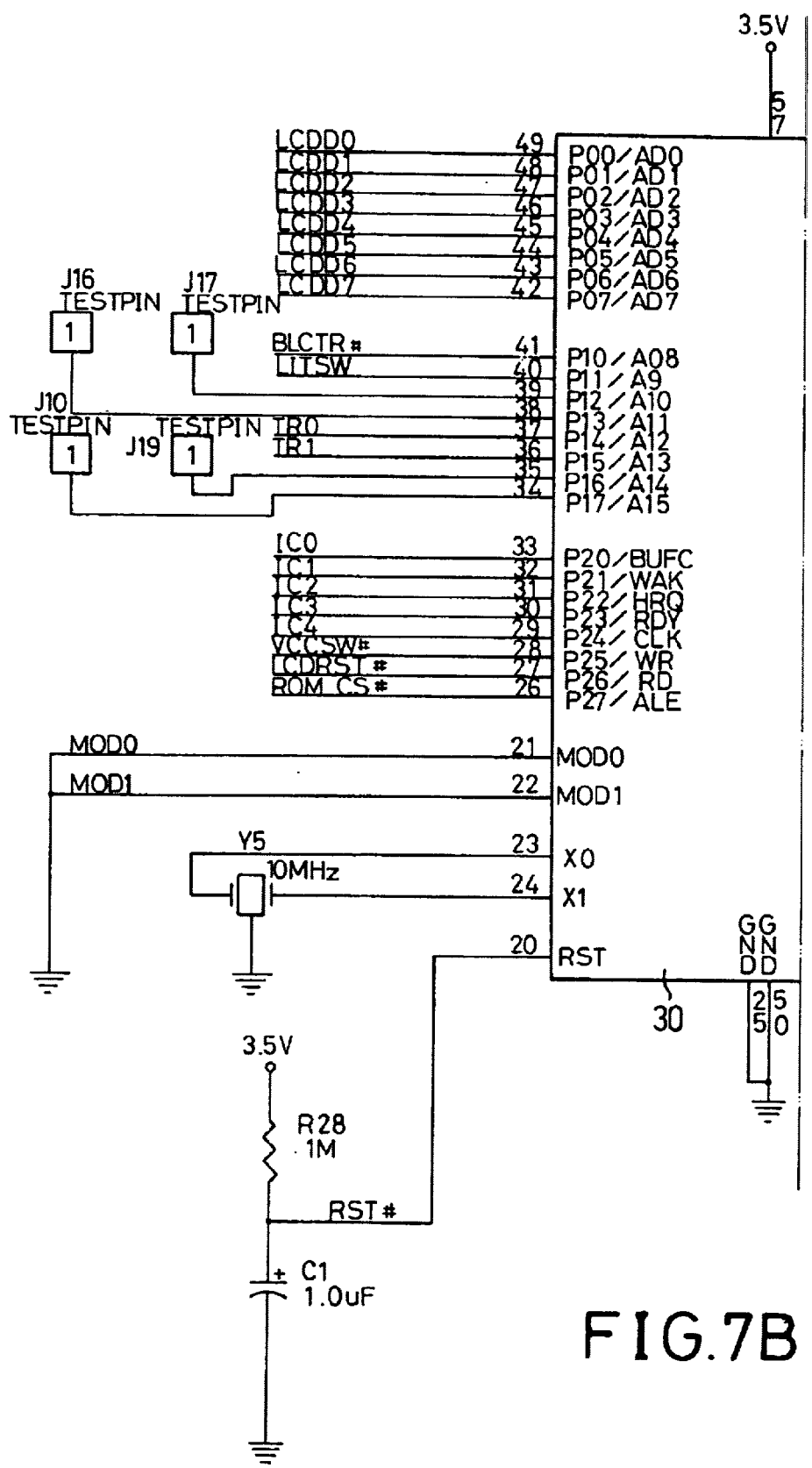
Figure 7C:
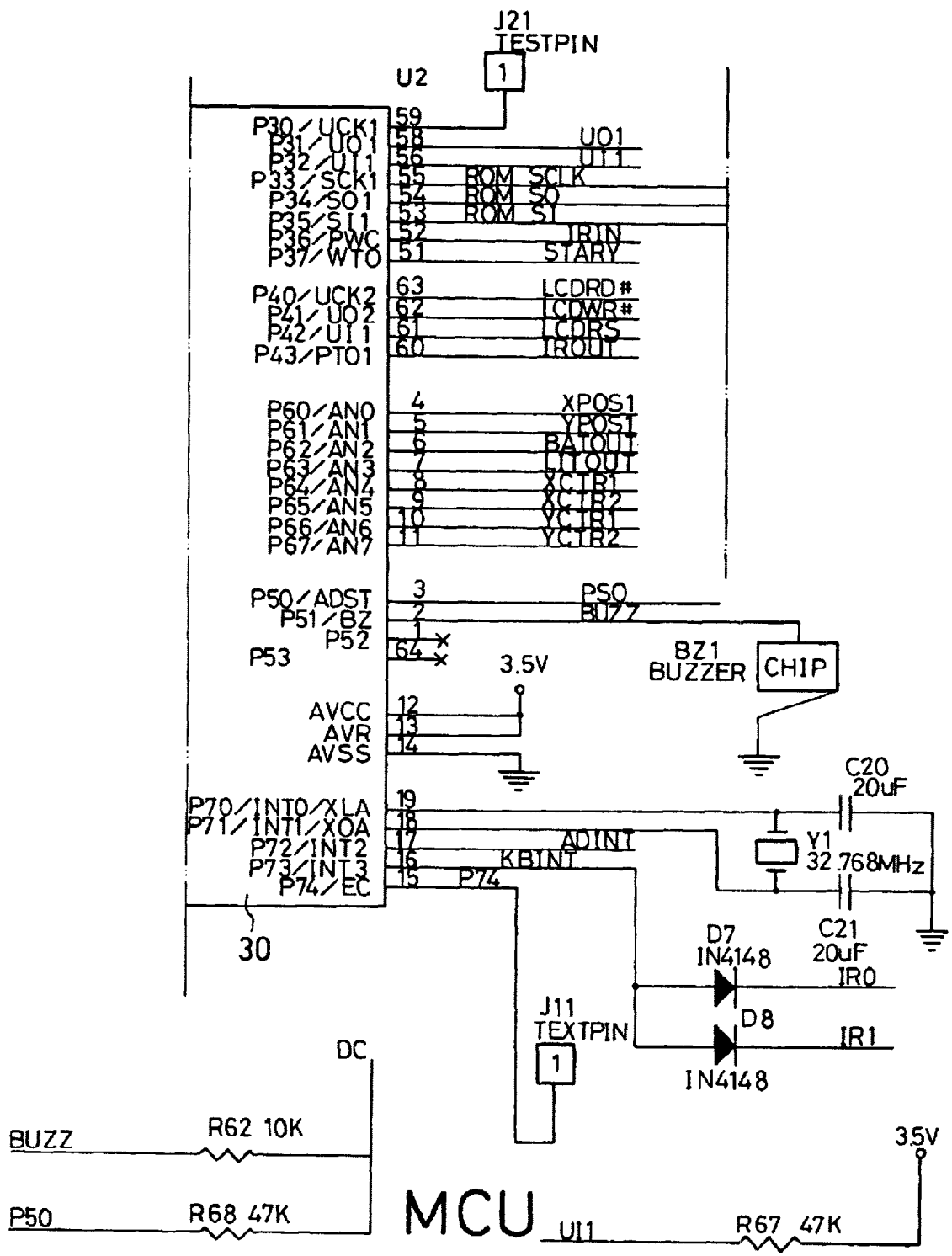
Figure 7D:
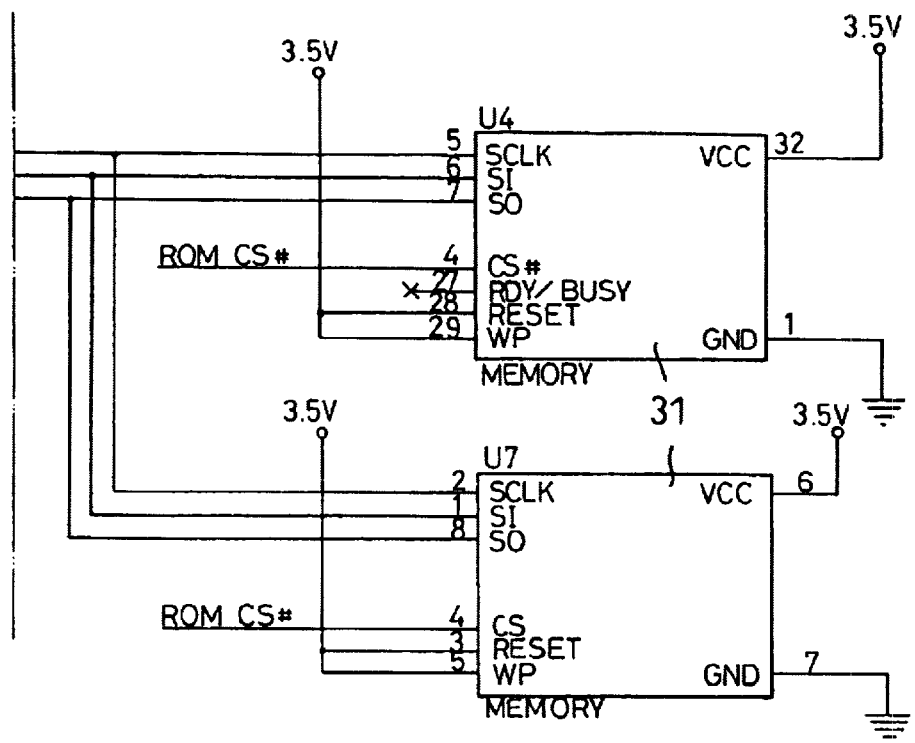
Figure 7D:
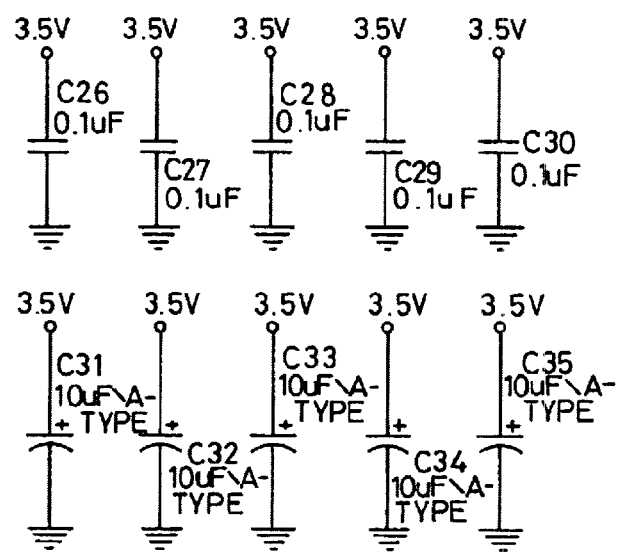
Figure 7E:
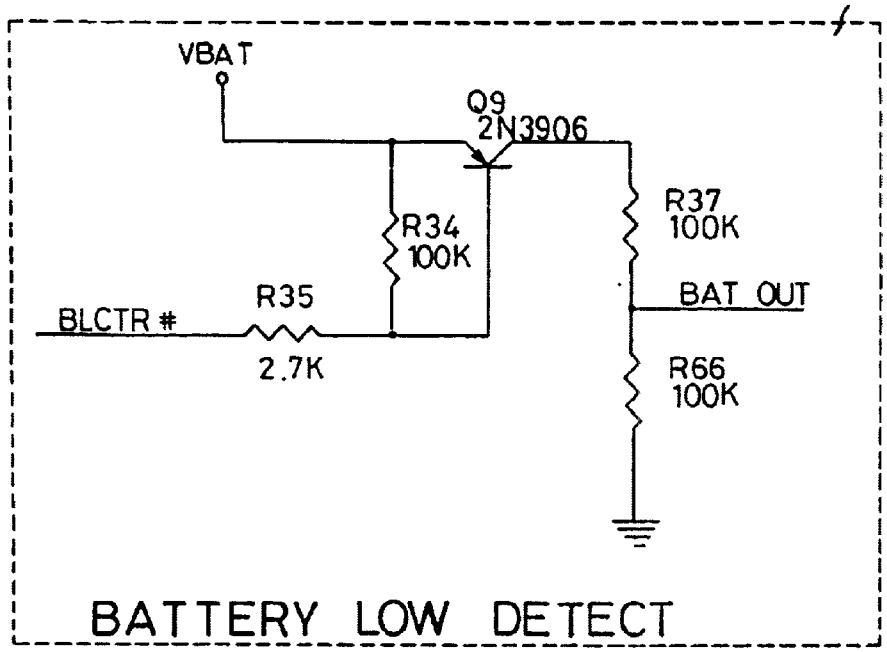
Figure 7E:
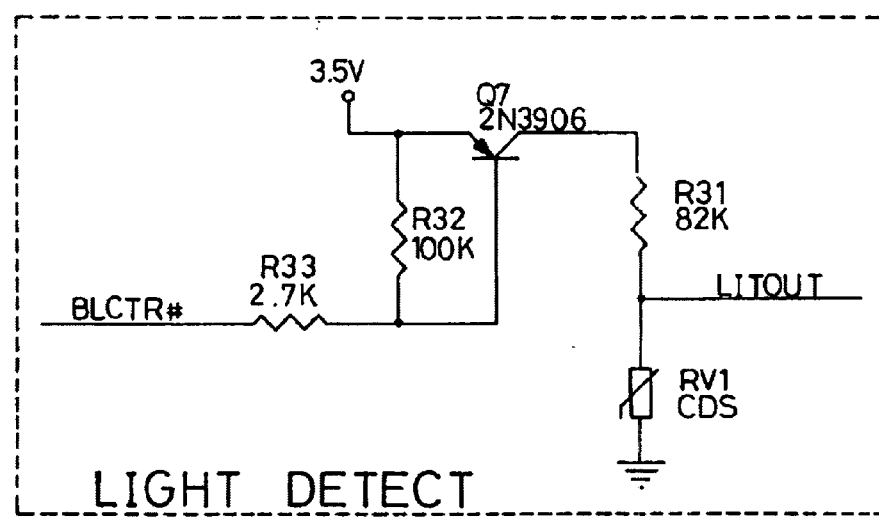
Figure 7E:
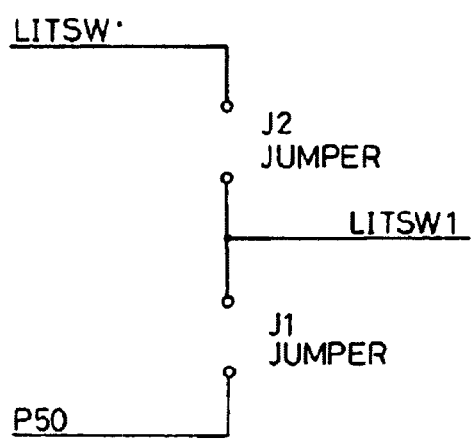
Figure 7F:
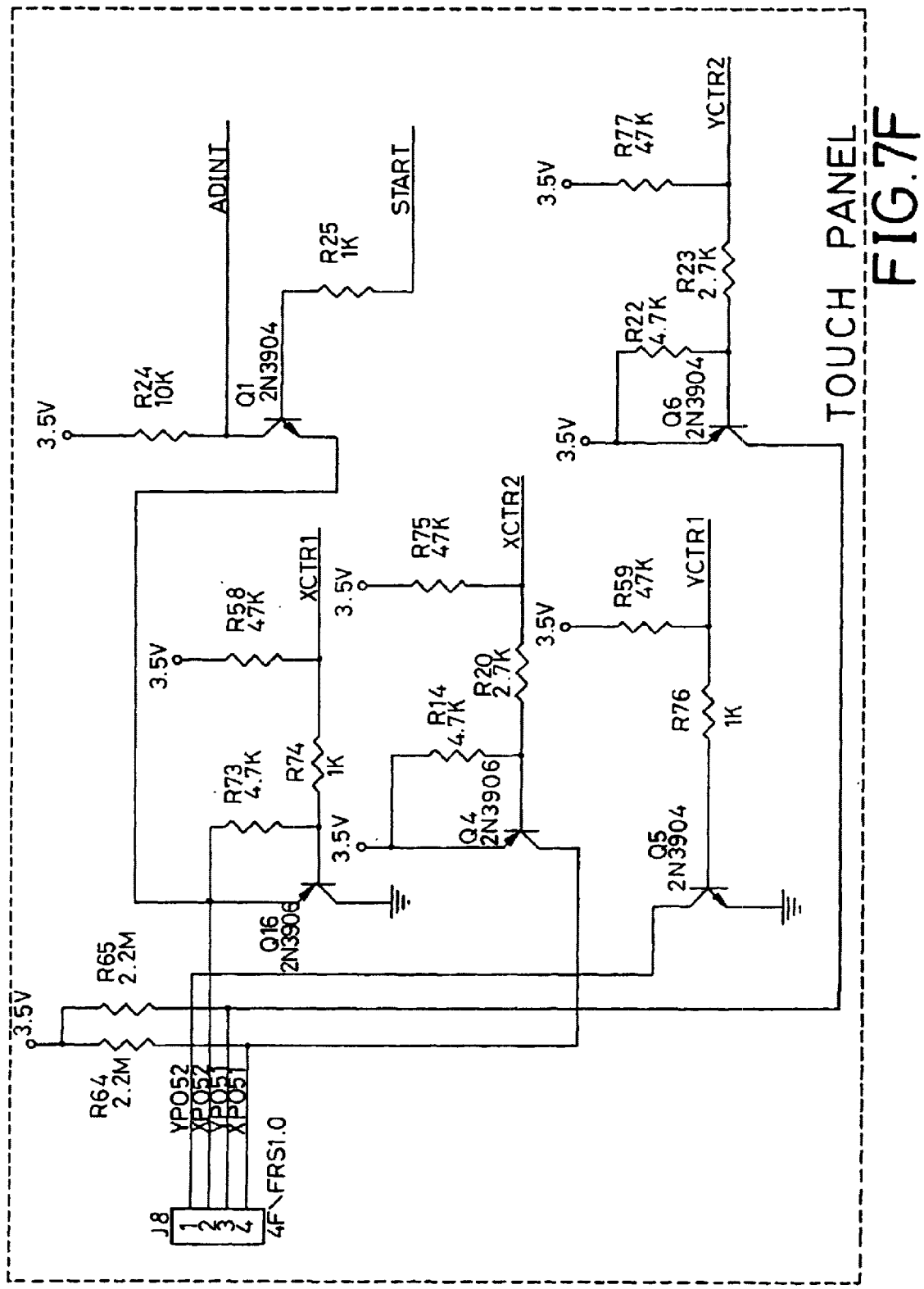
Figure 7G:
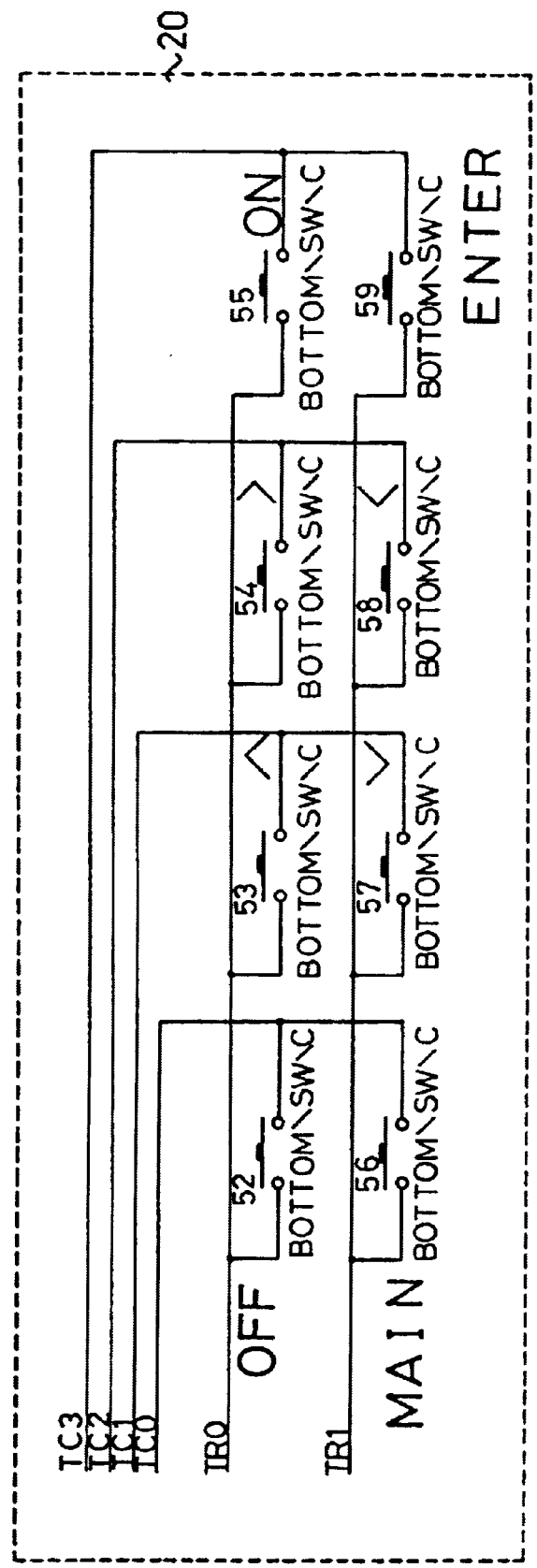
Figure 7H:
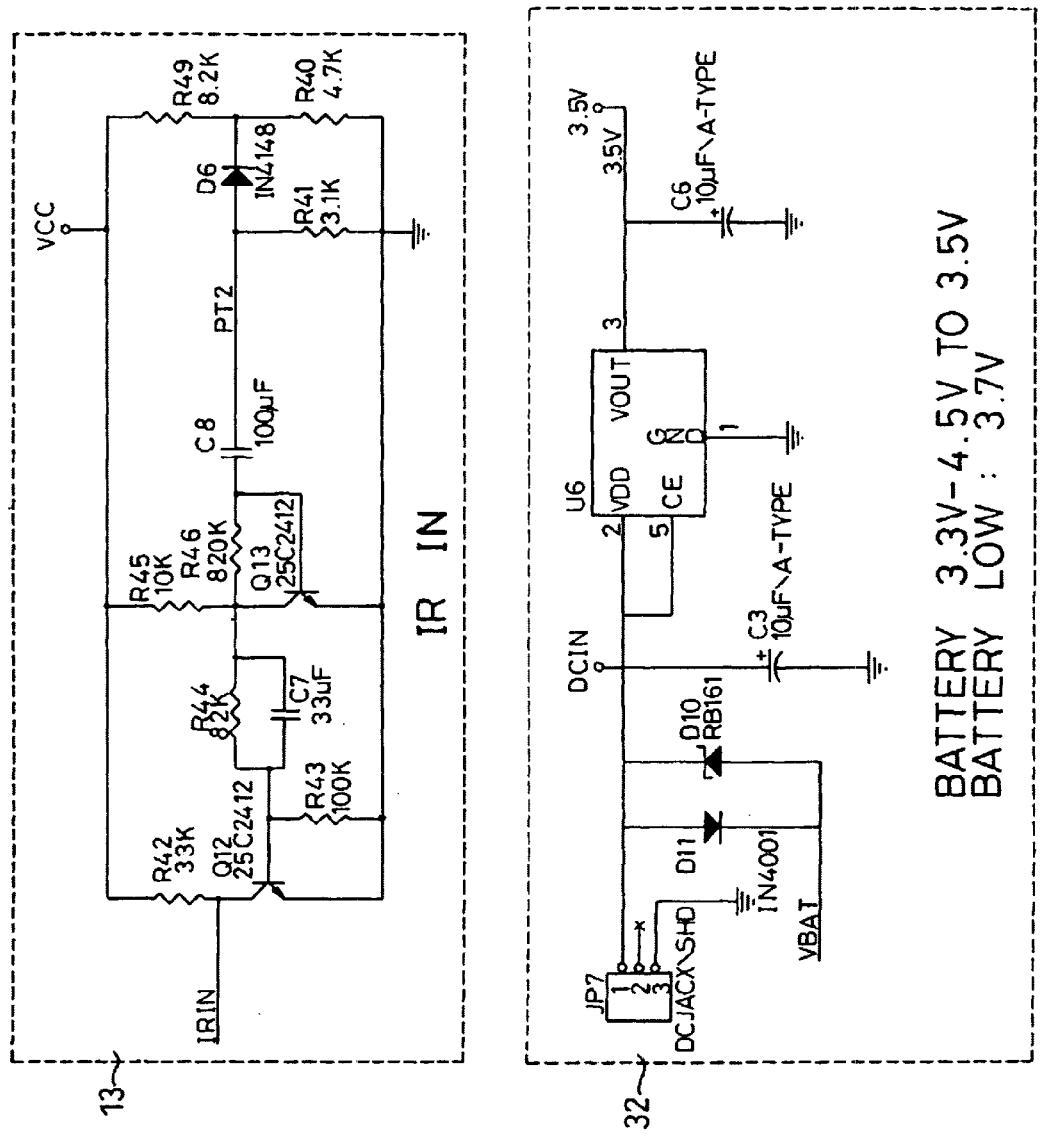
Figure 7I:
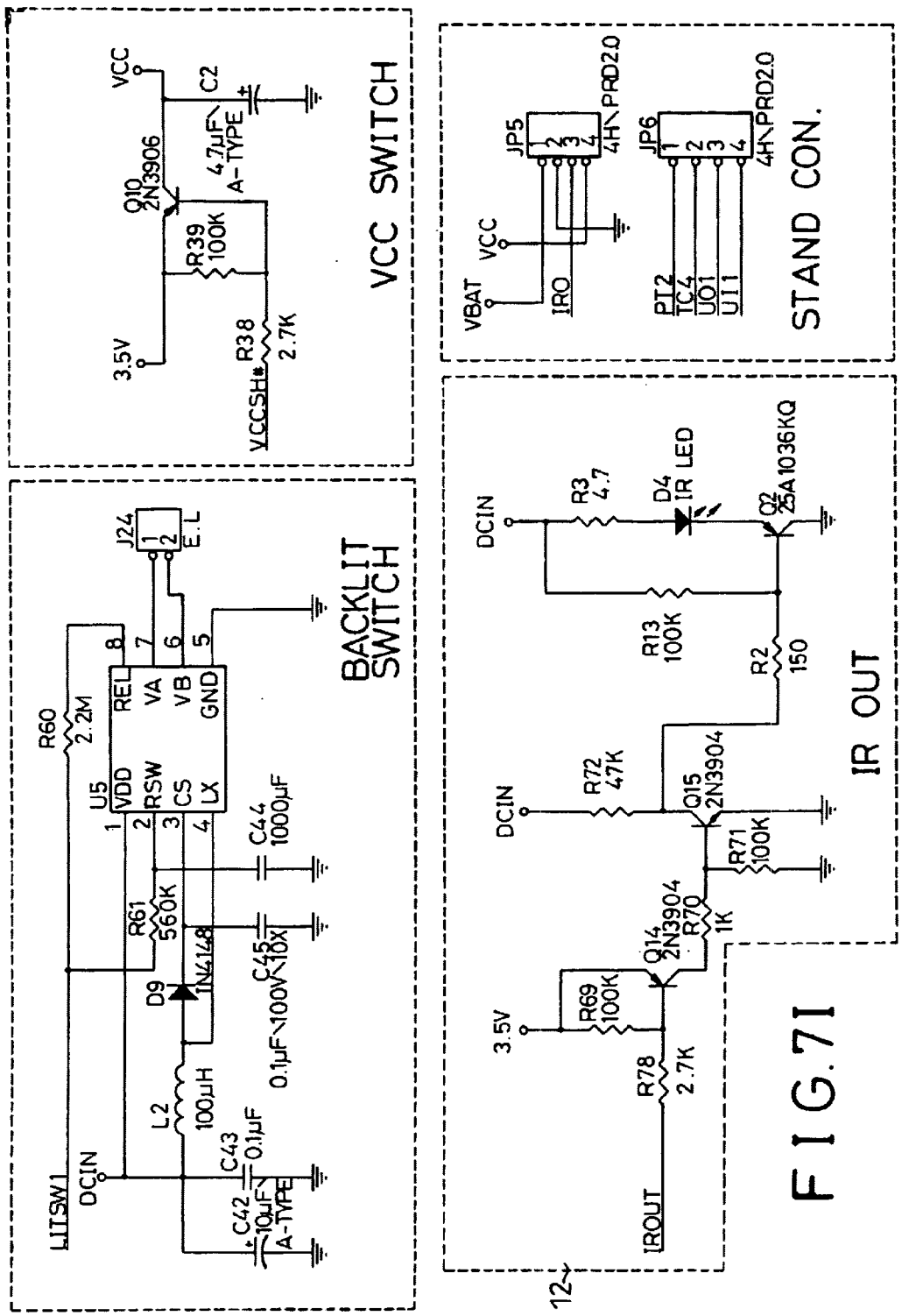

FIG. 6 shows the structure of the processing unit, which includes a microprocessor 30 and a memory unit 31 connected to the microprocessor 30. The microprocessor 30 is further connected to the touch-type screen 11, infrared transmitted 12, infrared receiver 13 and basic button set 20. The memory unit 31 is provided to store various control commands, user-defined data and default remote control codes for different manufacturers'. The circuit diagram of the processing unit is given in FIGS. 7A–7I, which also includes a low voltage detection circuit 33 and a power circuit 32 for supplying power to the processing unit.

The processing unit, is able to implement the various functions, including the learning procedure for programming the remote control code for a specific button, present on the touch-type screen 11 and operated by the basic button set 20.

Figure 8A:
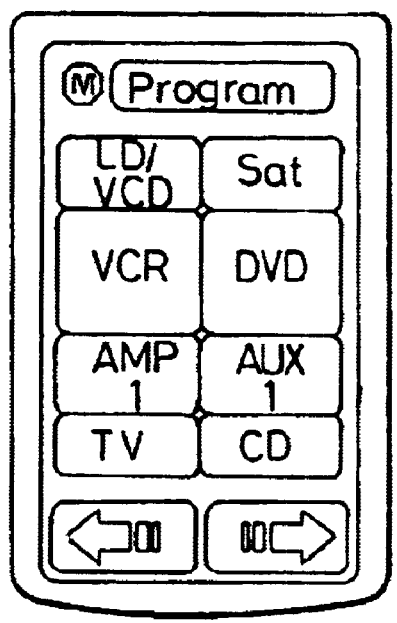
FIGS. 8A and 8B schematically illustrate screens for a program item under the setting menu.
Figure 8B:
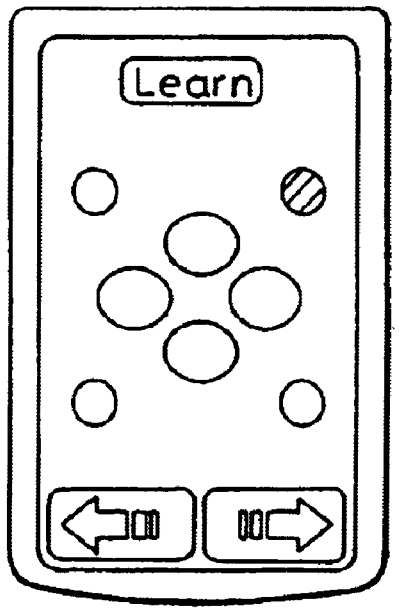
Figure 9:
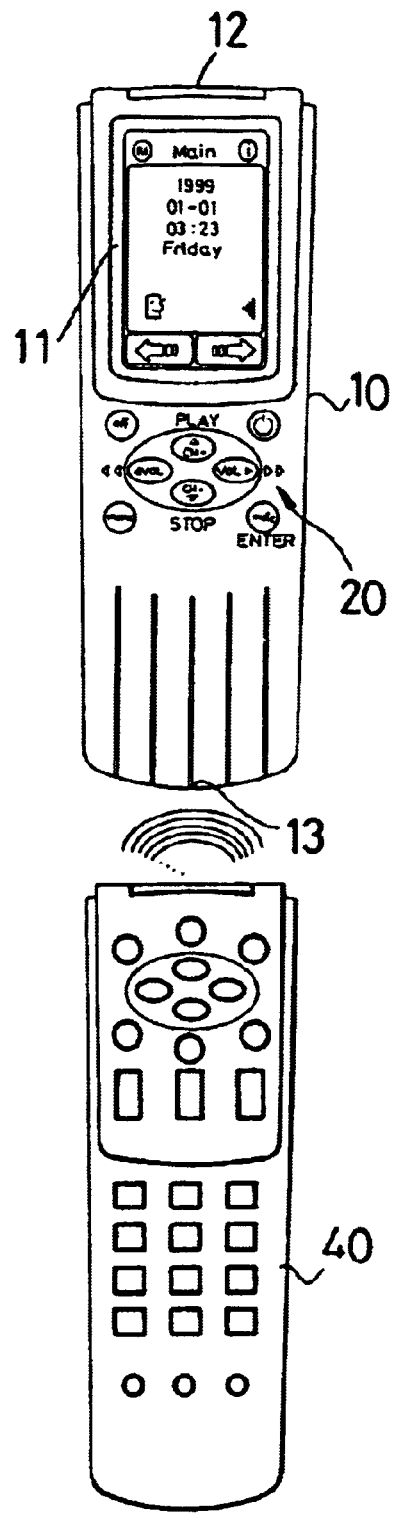
FIG. 9 schematically illustrates learning of remote control codes.
Figure 10:
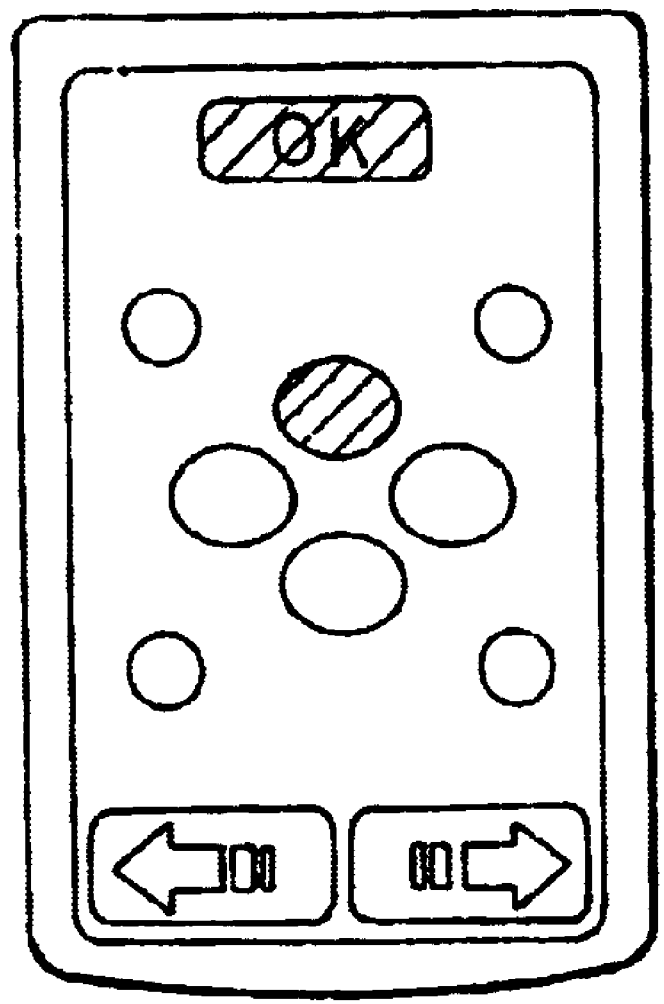
FIG. 10 schematically illustrates that a message is displayed on the touch-type screen after completing a learning procedure.

There are two kinds of learning procedures available. The first one is referred to as an automatic learning procedure. With reference to FIG. 5 again, when the 'program' item in the setting menu is selected, the touch-type screen 11 displays a screen as shown in FIG. 8A, which has a menu corresponding to the electrical appliances to be controlled. The items in the menu can be touched and selected by the user. Subsequently, a pattern of the basic button set 20 is present and one of the buttons, for example the upper right button, is inverted, as shown in FIG. 8B. The upper right button is corresponding to the power on button 21 of the basic button set 20. Therefore, as shown in FIG. 9, an original remote control 40 is placed to have its transmitter facing the infrared receiver 13 of the remote control body 10. Then, the power on button of the original remote control 40 is pressed to transmit the corresponding remote control code for being received by the infrared receiver 13 and transferred to the processing unit in the remote control body 10. The received remote control code is thus defined as the transmission code of the power on button 21. After completing such a learning procedure, an 'OK' message is displayed on the touch-type screen 11, as shown in FIG. 10, and another button to be programmed next is inverted. Similarly, this button and all the other buttons of the basic button set 20 can be programmed by the same learning procedure, which is easy to carry out without the need of using both hands at the same time.

Figure 11A:
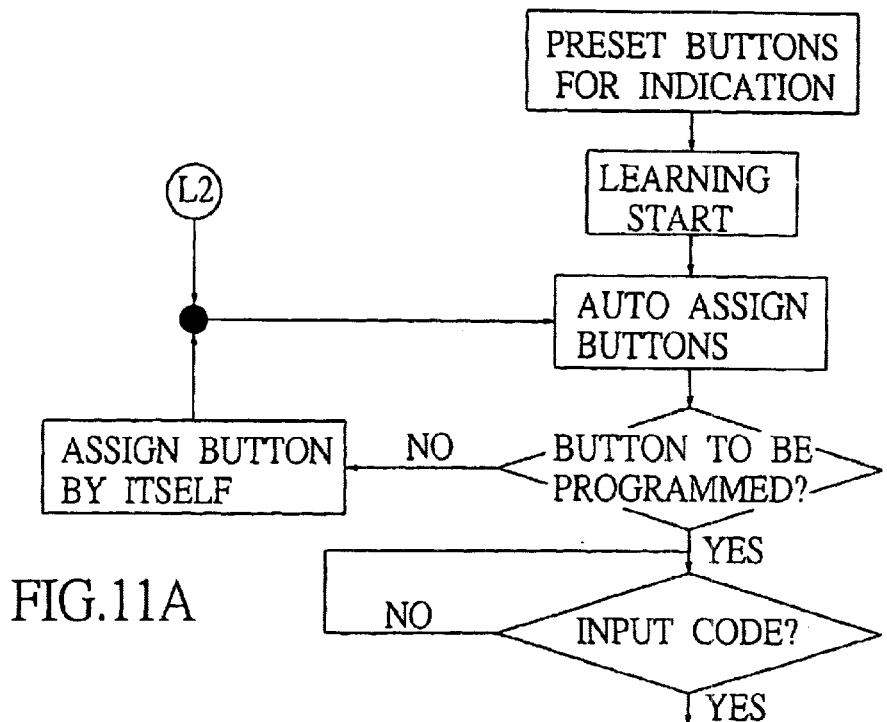
FIGS. 11A and 11B show a flow chart of an automatic learning procedure in accordance with the present invention.
Figure 11B:
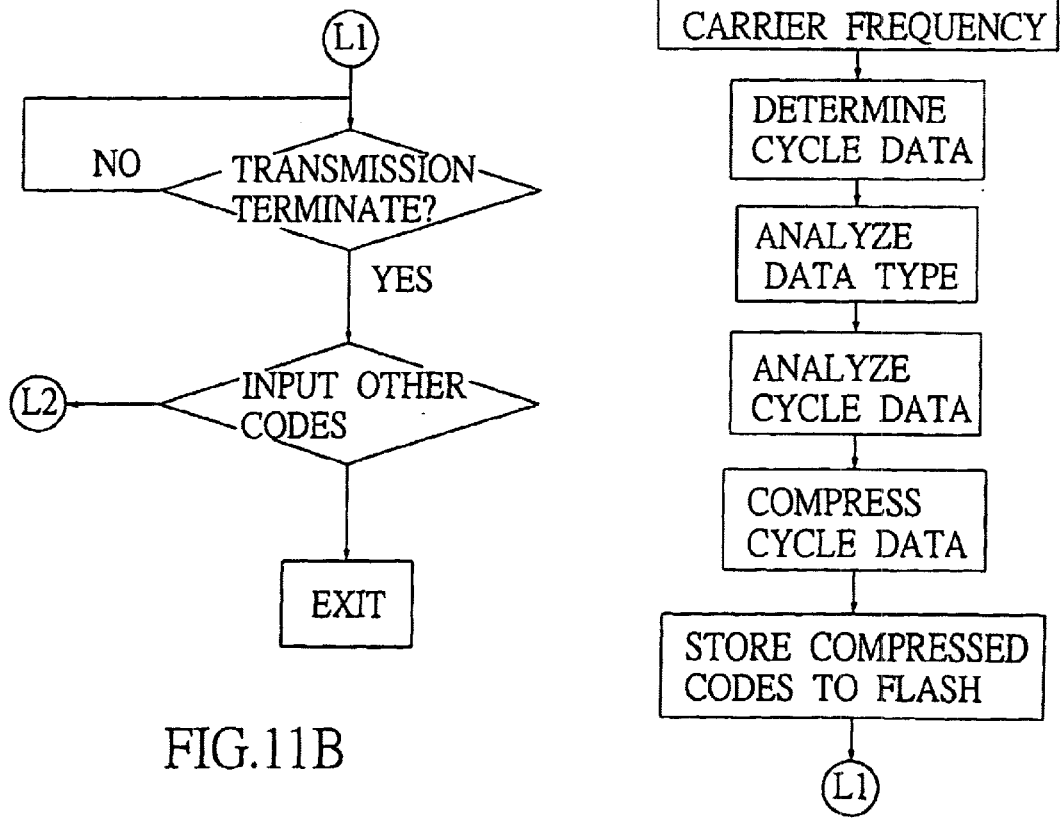

The flow chart of the above automatic learning procedure is shown in FIGS. 11A and 11B, which includes:

an automatic button assignment step in which the universal remote control automatically assigns a button to be programmed;

a first determination step for determining whether the assigned button is going to be programmed, and whether a remote control code is entered;

a calculation step for determining the carrier frequency and cycle of the entered remote control code;

an analysis/storage step to analyze the data type and cycle of the remote control code for being compressed and stored; and a second determination step for determining whether the transmission of the remote control code is terminated.

After accomplishing the above steps, the remote control code for a specific button is thus learned. Similarly, other buttons can be programmed by the same learning steps.

Figure 12:
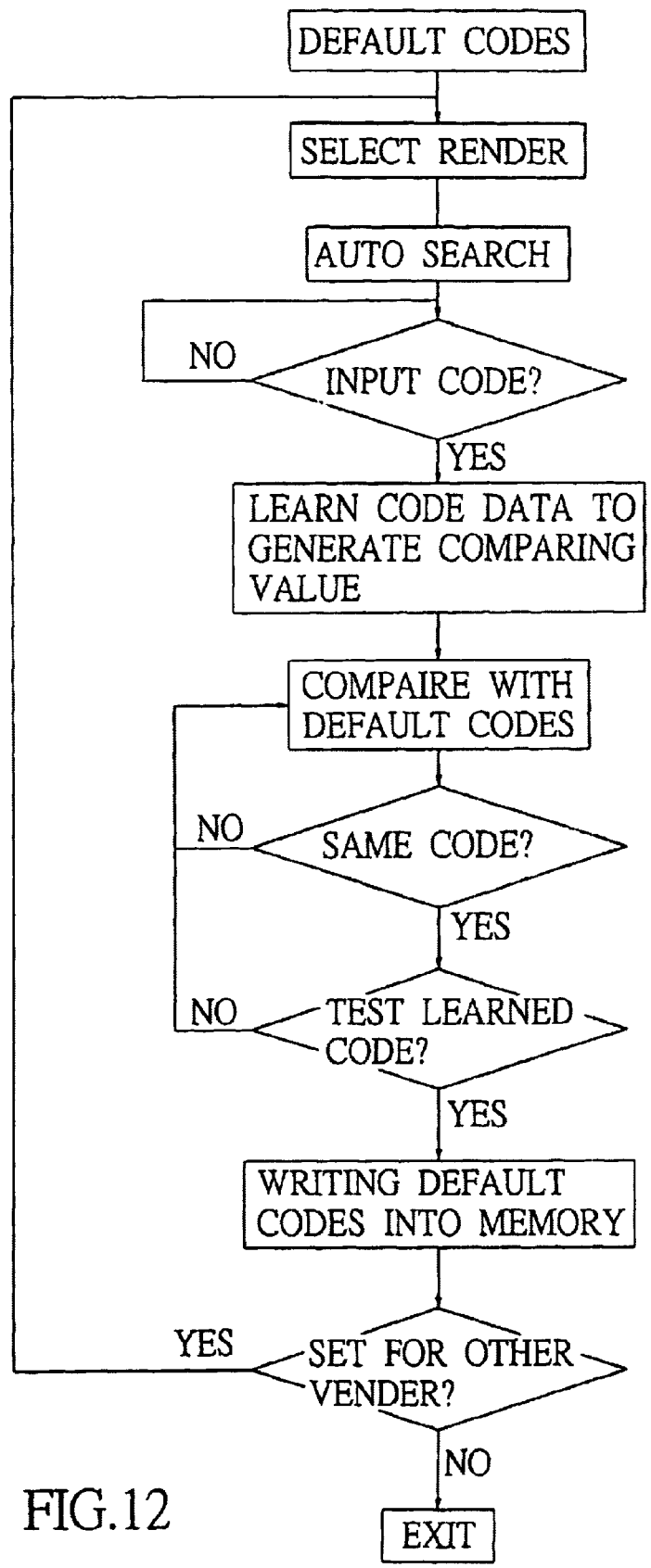
FIG. 12 is a flow chart of an automatic searching procedure in accordance with the present invention.

The second kind of learning procedure is referred to as an automatic searching procedure. As described hereinbefore, the memory unit 31 of the processing unit is stored with the remote control codes of various manufacturers. With the automatic searching procedure, this structure provides an automatic searching function to compare the default remote control codes and the remote control codes from the original remote control. That is, the user can select the automatic searching function on the touch-type screen 11 and then use the original remote control to transmit remote control codes to the remote control body 10. As such, the microprocessor 30 of the processing unit compares the received remote control codes and the default remote control codes. If a matched one is found, a message is displayed on the touch-type screen 11 to notify the user to test the remote control. If the test is successful, the learning procedure is completed, and the matched default remote control code is stored in a specific location of the memory unit 31. Subsequently, the learning procedure can be terminated by exiting the program item or repeated for other manufacturers' appliances. The control flow chart of the automatic searching procedure is shown in FIG. 12, which includes:

a remote control code determination step to determine whether there is a remote control code input after starting the automatic searching;

a comparing value generation step in which the universal remote control automatically learns the data of the remote control code so as to generate comparing value;

an automatic comparing step to compare the comparing value and the default remote control codes, and determine whether there is a same remote control code in the remote control;

a prompt and test step for displaying a message to notify the user to test the learned remote control code and confirm its correctness; and a storage procedure for writing the confirmed default remote control code into a specific location of the memory unit 31.

After completing the above steps, the automatic searching procedure can be terminated or repeated for other manufacturers' appliances.

Figure 14:
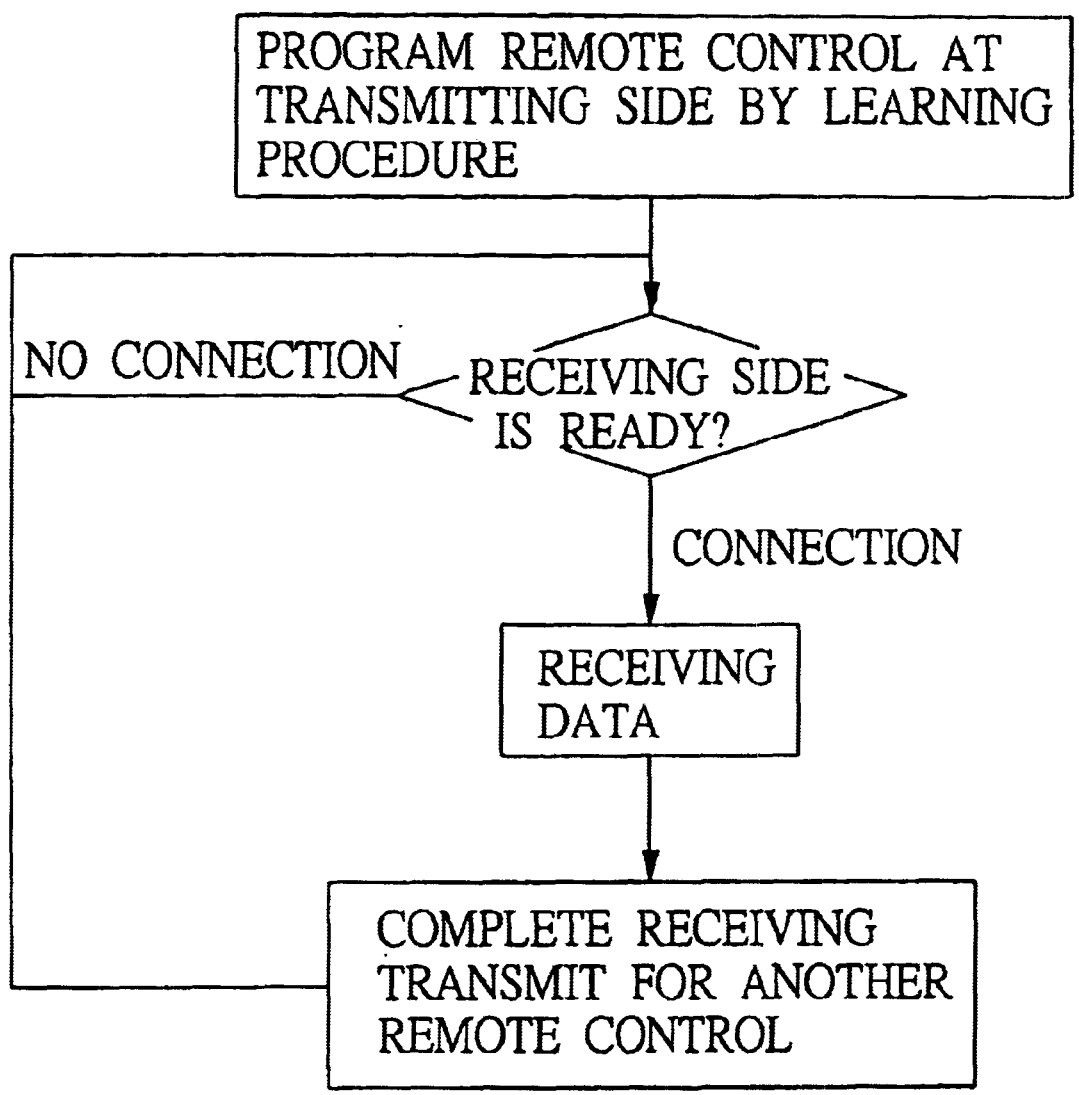
FIG. 14 is a flow chart of a duplicate process for copying settings from a remote control to another one.

No matter what kind of learning procedure is used, the duplicate item in the setting menu can be used, when a universal remote control has been programmed, to copy the settings to other universal remote controls. In such a duplicate process, the signals are transferred via the infrared transmitter 12 and receiver 13 of the universal remote control. The detailed control flow for this duplicate process is shown in FIG. 14.

Figure 15A:
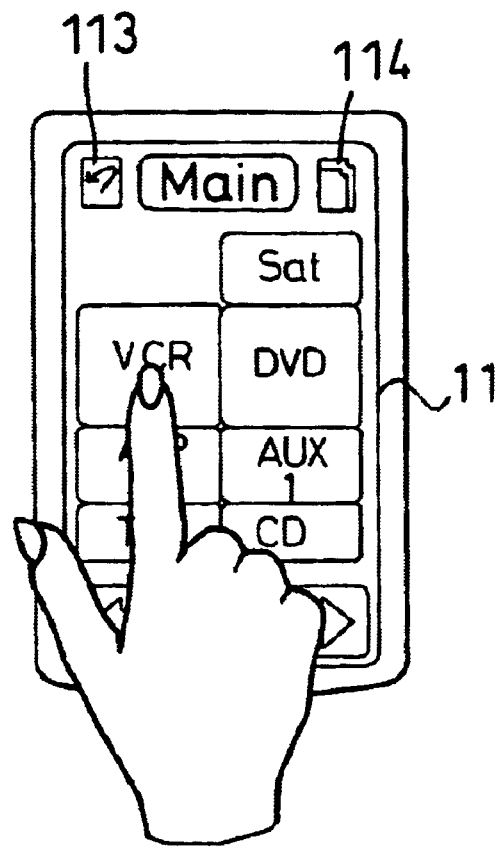
FIGS. 15A–15E schematically illustrate the process to change the size and position of an item in accordance with the present invention.
Figure 15B:
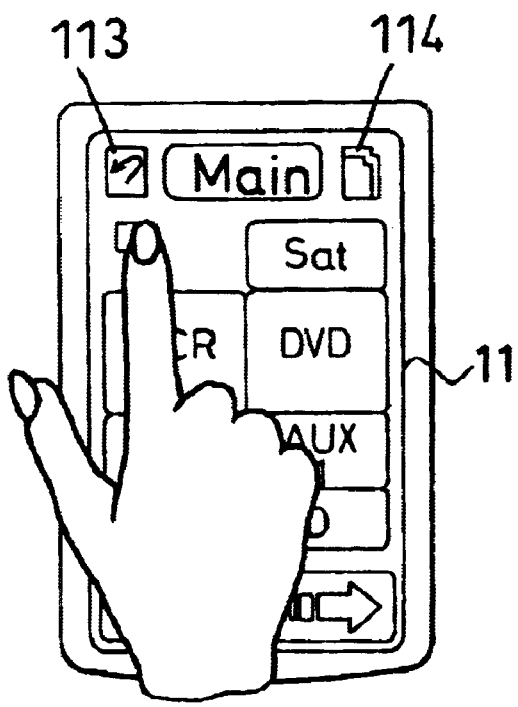
Figure 15C:
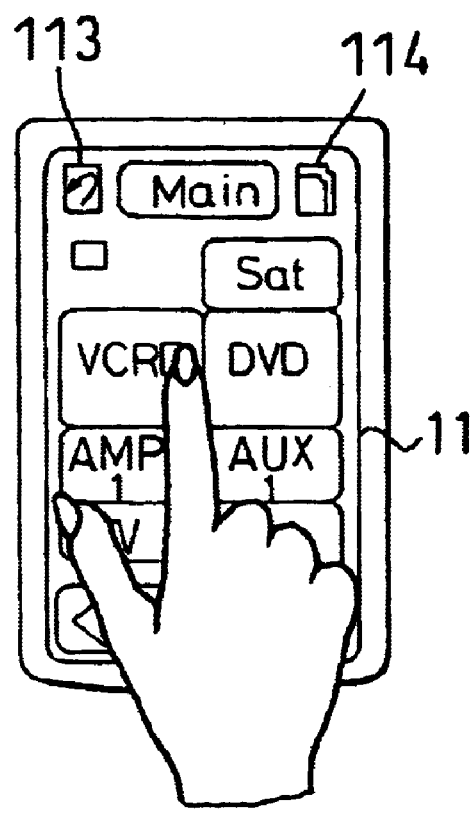
Figure 15D:
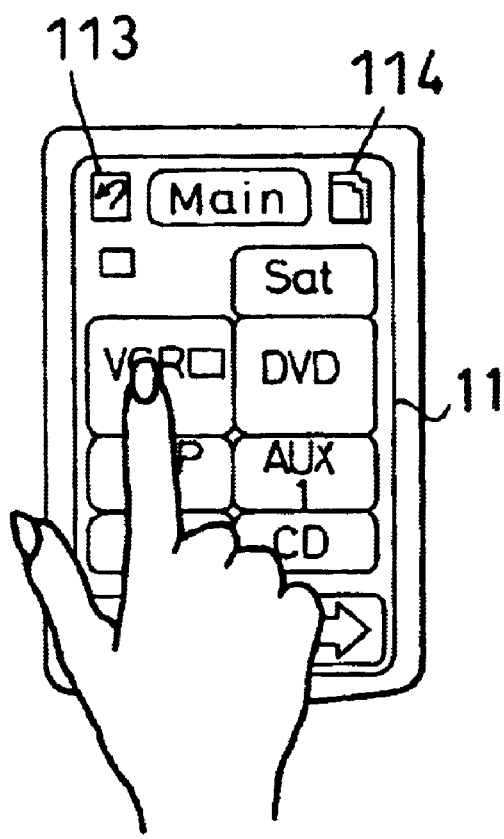
Figure 15E:
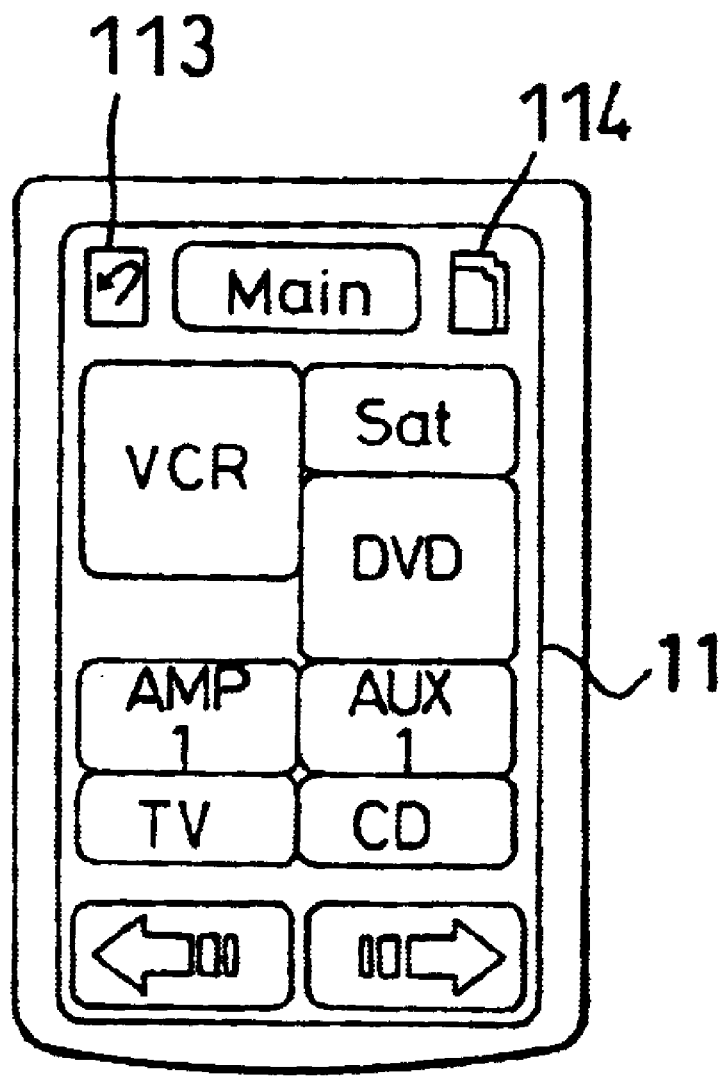
Figure 16:
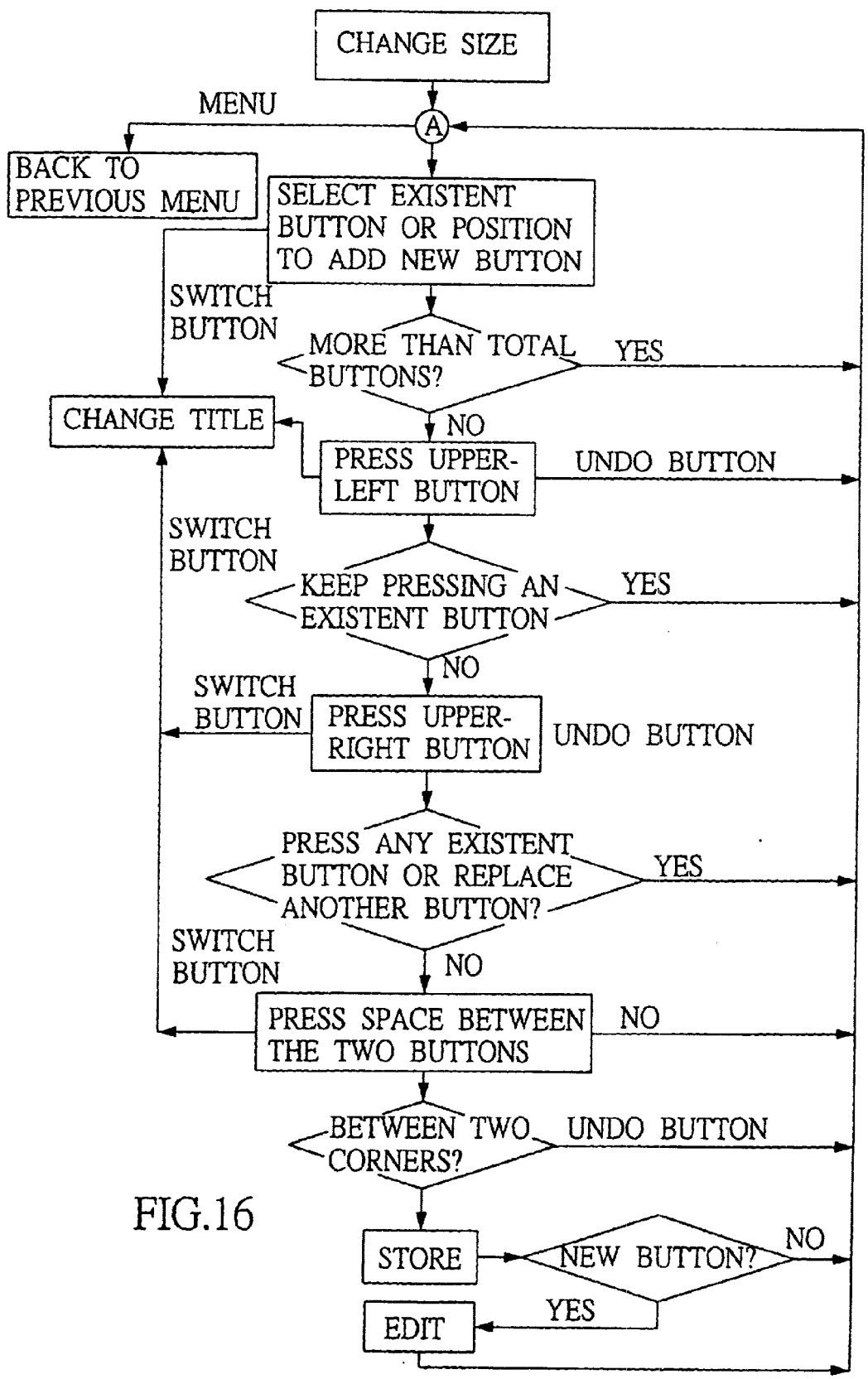
FIG. 16 is a flow chart to change the size and position of an item in accordance with the present invention.

Furthermore, the adjust item in the setting menu is used to change the size and position of each touch-type item in the main menu. With reference to FIG. 15A, there is shown a screen corresponding to the adjust item, which is the same as that of the main menu, except that there is an undo button 113 and a switch button 114 on the supper-left and upper-right portion of the screen. The change of the size and position of the touch-type items is provided to satisfy the user's habit and preference. An example of changing the size and position of the VCR item is given as follows:

First, the user touches the VCR item, as shown in FIG. 15A, and also touches the touch-type screen at a desired position, for example the upper-left portion, as shown in FIG. 15B. As such, a small block pattern is present at the desired upper-left portion as a mark. Next, the user touches the touch-type screen 11 at a diagonal position corresponding to the small block pattern, so as to have another small block pattern appear thereon, as shown in FIG. 15C. The area between these two block patterns is used to define the new position and size for the VCR item. When the user touches the VCR item again, as shown in FIG. 15D, the VCR item is moved to the new position with a new size, as shown in FIG. 15E. The detailed control flow for the above adjust process is given in FIG. 16.

Figure 17:
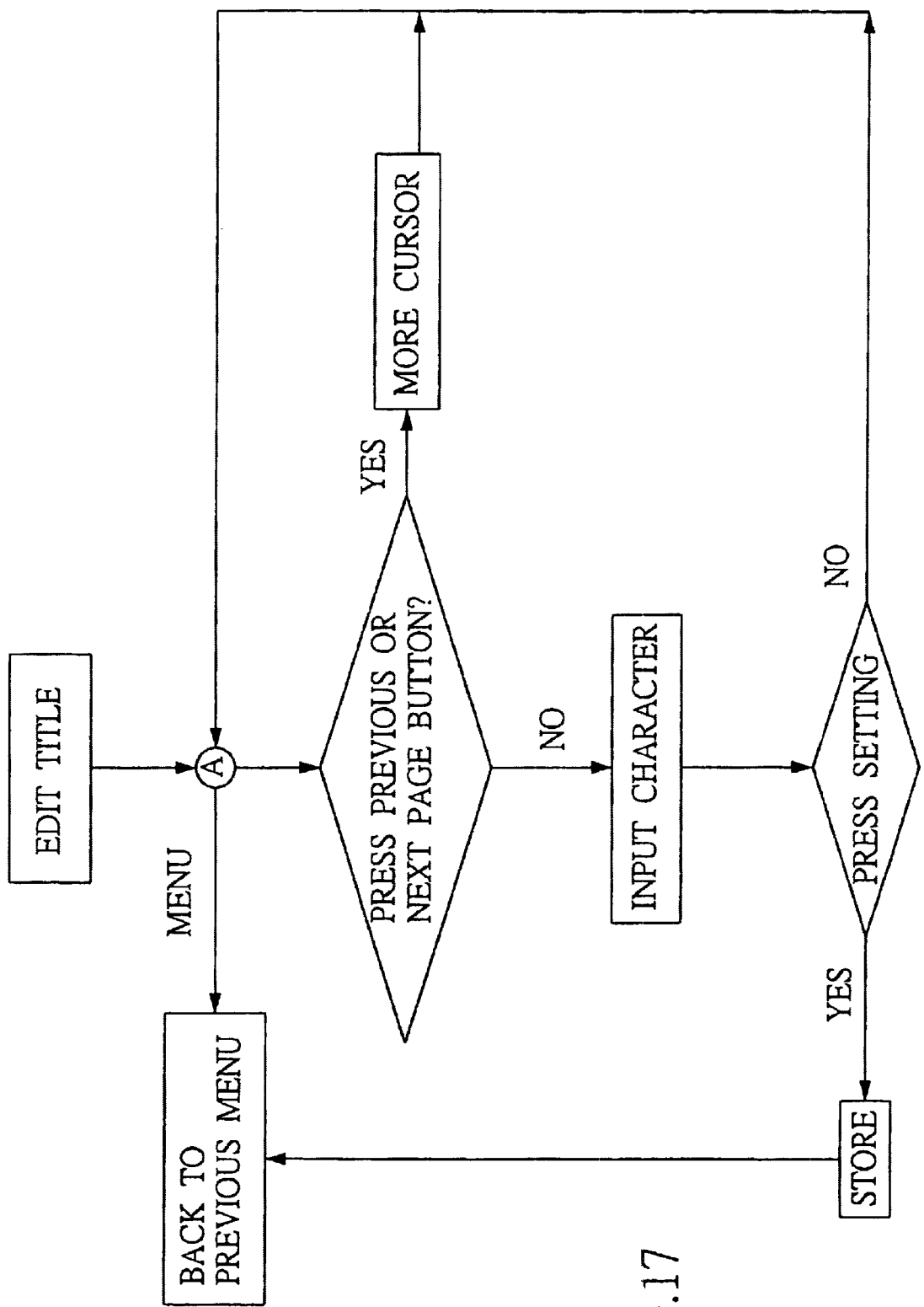
FIG. 17 is a flow chart to change the title of an item in accordance with the present invention.
Figure 18:
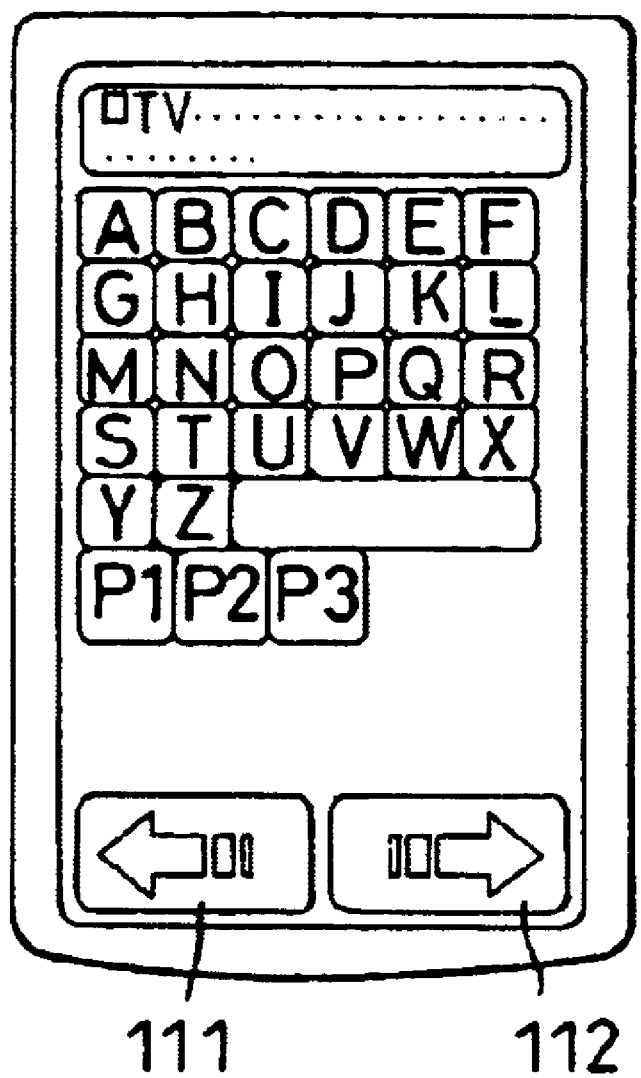
FIG. 18 schematically illustrates the screen for changing the title of an item in accordance with the present invention.

In addition to changing the size and position of an item, it is also applicable to change the title of the item. FIG. 17 shows a control flow to change the title for each item. As shown, when entering an edit text mode, a keyboard pattern is present on the touch-type screen, as shown in FIG. 18. At this moment, the user can use the previous page button 111 and the next page button 112 at the bottom of the screen to select the re-defined characters. After such a key-in operation is done, the user can press the mute/enter button 24 of the basic button set 20 to complete the change of the title for an item.

Figure 19A:
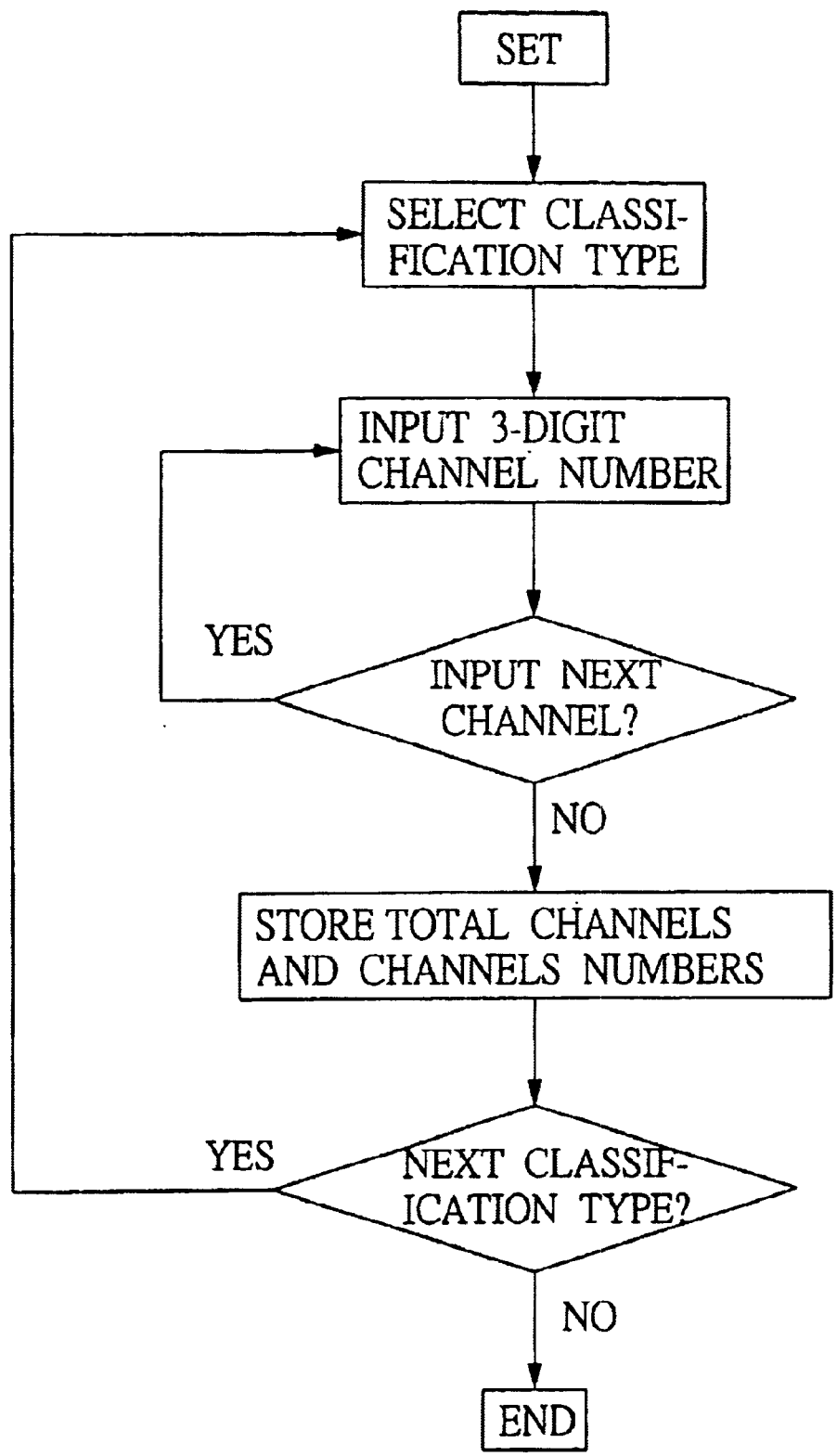
FIG. 19A is a flow chart for a channel classification function in accordance with the present invention.

Moreover, FIG. 19A shows control flow of the channel classification function, which first selects the classification type, such as 'news', 'recreation', 'sport', etc., after entering the channel classification setting menu via the main menu. When a desired classification type is selected, the channel numerals of the corresponding channel are entered and stored. Then, such a channel classification setting process is terminated or repeated for setting other classification types. This channel classification function can also be used to gather the viewer's favorite channels, instead of the channels of the same type.

Figure 19B:
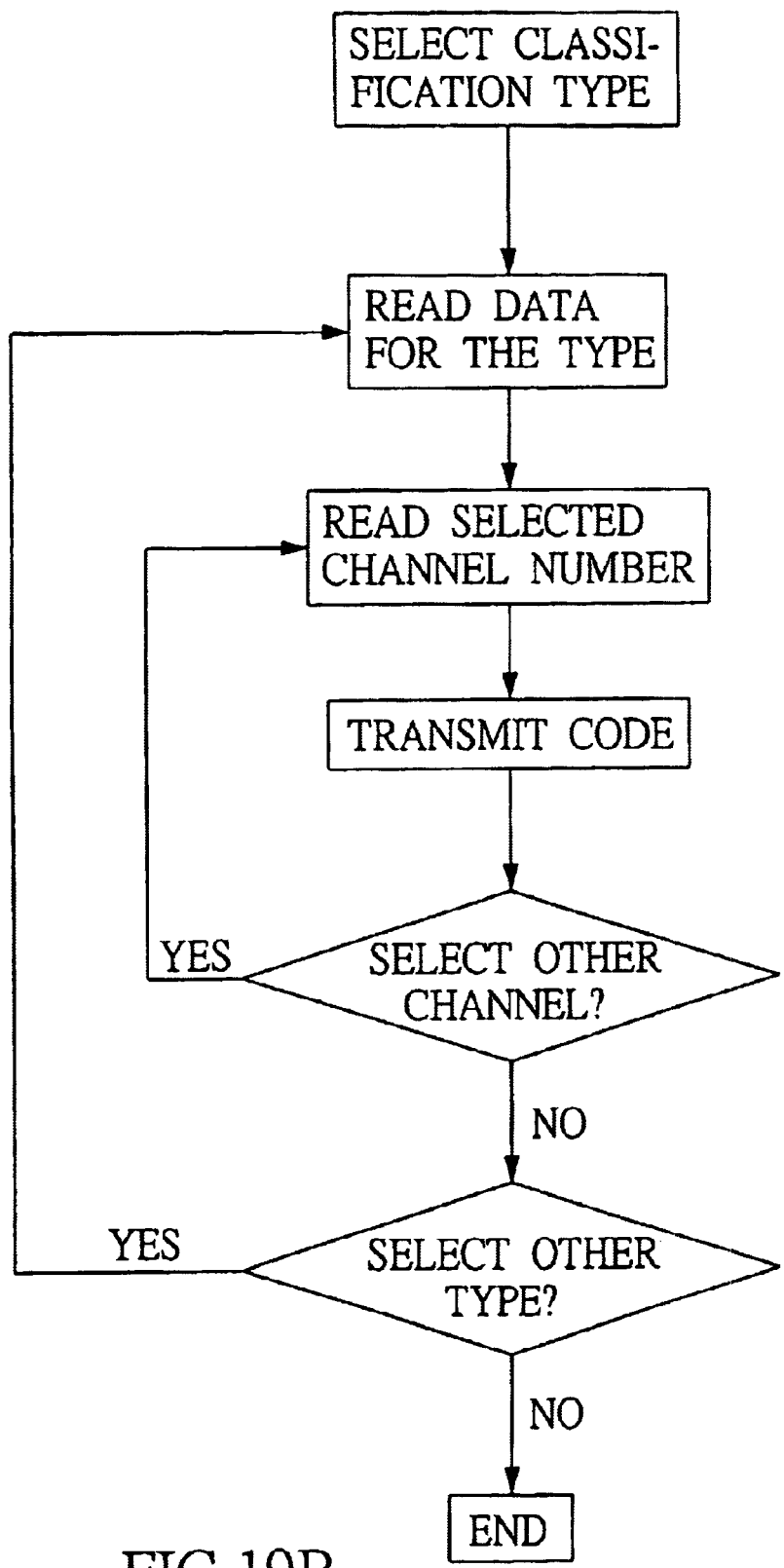
FIG. 19B is a flow chart for using the channel classification function in accordance with the present invention.

In use of the channel classification function, as shown in FIG. 19B, a channel classification item is selected from the main menu so that the data of all the channels corresponding to the selected classification type is read out. When a desired channel is read, the universal remote control automatically sends the remote control code of the channel to complete the channel select operation.

Furthermore, the microprocessor 30 of the processing unit is built with a timing function for providing a remote timer capability. That is, multiple remote timers are provided, and each remote timer can be used to activate a specific electrical appliance when its timing count is finished. Therefore, the timers simply can be set and the universal remote control placed to face a signal receiver of the controlled electrical appliances, so as to transmit remote control codes to the electrical appliances and thus activate the electrical appliances when the setting counts are reached. Such a timer capability can be combined with the macro function to initiate a series of remote control operations when a setting time is reached.

In addition, for the remote timer capability and the macro function, there is generally a plurality of items available, and each item is denoted by a sequence number. When the quantity of items gets large, it is not each for the user to remember the function of each item by the sequence number. Therefore, the processing unit provides a re-define function, which is similar to the edit test mode in the adjust process, to define a new title for each item, so that the user can be aware of its function easily.

In view of the foregoing, it is appreciated that the intelligent touch-type universal remote control in accordance with the present invention is provided with the following advantages:

(1) The menu items can be designed based on the user's preference, such that the interface is user-friendly.

(2) The use of touch-type screen in conjunction with page selection buttons make the operation easy.

(3) The learning procedure is performed by operating one key at a time, thereby greatly improving the convenience in the learning process.

(4) The macro button is provided with the transmission delay function such that the controlled electrical appliances can properly receive the remote control codes corresponding to the macro button.

Although the present invention has been explained in relation to its preferred embodiment, it is to be understood that many other possible modifications and variations can be made without departing from the spirit and scope of the invention as hereinafter claimed.

What is claimed is:

1. An intelligent touch-type universal remote control comprising:

a body;

a touch-type screen arranged on the body;

an infrared transmitter arranged at a predefined position of the body for transmitting remote control codes;

an infrared receiver arranged at a predefined position of the body for receiving remote control codes to perform a learning procedure;

a basic button set arranged on the body; and a processing unit arranged in the body, the processing unit having a microprocessor and a memory unit, the microprocessor being connected to the touch-type screen, infrared transmitter, infrared receiver and basic button set, the memory unit being provided to store default remote control codes and control commands, wherein, the touch-type screen can be activated by operating the basic button set to display a main menu page having a macro button, a previous page button, a next page button, and multiple items, each further corresponding to at least one menu page, for corresponding to various appliances to be controlled, each button being selected simply by touching, and, wherein the touch-type screen can be activated by operating the basic button set to display a main menu page having a macro button, a previous page button, a next pace button, and multiple items, each further corresponding to at least one menu page, for corresponding to various appliances to be controlled, each button being selected simply by touching, and, wherein the touch-type screen can be activated by operating the basic button set to display a setting menu for programming the universal remote control, wherein the setting menu has a program item for selecting an automatic learning procedure that includes:

an automatic button assignment step in which the universal remote controller automatically assigns a button to be programmed;

a first determination step for determining whether the assigned button is going to be programmed, and whether a remote control code is entered;

a calculation step for determining the carrier frequency and cycle of the entered remote control code;

an analysis/storage step to analyze the data type and cycle of the remote control code for being compressed and stored; and a second determination step for determining whether the remote control code is terminated in transmission.

2. The intelligent touch-type universal remote control as claimed in claim 1, wherein the basic button set includes a power on button, a power off button, a menu/setting button, a mute/enter button, a channel-up/play button, a channel-down/stop button, a volume/backward button, and a volume/forward button, the menu/setting button being used to activate the touch-type screen to display the main menu and the setting menu.

3. The intelligent touch-type universal remote control as claimed in claim 1, wherein the setting menu has an adjust item for changing the size, position and title of each item on the touch-type screen.

4. The intelligent touch-type universal remote control as claimed in claim 3, wherein the size and position of an item is changed by the steps of:

touching the item to be changed;

touching the touch-type screen at a desired position;

touching the touch-type screen at a diagonal position corresponding to the desired position, so as to define a new position and size for the item; and touching the item again, so that the item is moved to the new position with a new size.

5. The intelligent touch-type universal remote control as claimed in claim 3, wherein the title of an item is changed by the steps of:

entering an edit text mode in which a keyboard pattern is present on the touch-type screen;

using the previous page button and the next page button to select re-defined characters; and pressing the mute/enter button.

6. The intelligent touch-type universal remote control as claimed in claim 1, wherein a channel classification item is positioned under a TV item of the main menu for managing CATV channels, so as to gather channels of the same type together for being controlled by a specific button.

7. The intelligent touch-type universal remote control as claimed in claim 6, wherein the channel classification function is performed by the steps of:

selecting a desired classification type; and entering channel identification numerals corresponding to the desired classification type for being stored.

8. The intelligent touch-type universal remote control as claimed in claim 1, wherein the setting menu has a timer item for providing a remote timer control capability.

9. The intelligent touch-type universal remote control as claimed in claim 1, wherein the setting menu has a program item for selecting an automatic searching procedure, which includes:

a remote control code determination step to determine whether there is a remote control code input;

a comparing value generation step in which the universal remote control automatically learns data of the remote control code so as to generate comparing value;

an automatic comparing step to compare the comparing value and the default remote control codes, and determine whether there is a same remote control code in the universal remote control;

a prompt and test step for displaying a message to notify the user to test a learned remote control code and confirm its correctness; and a storage procedure for writing the confirmed default remote control code into a specific location of the memory unit.

10. The intelligent touch-type universal remote control as claimed in claim 1, wherein the setting menu has a duplicate item to copy the settings of the universal remote control to other universal remote controls.

11. The intelligent touch-type universal remote control as claimed in claim 9, wherein the setting menu has a duplicate item to copy the settings of the universal remote control to other universal remote controls.

12. The intelligent touch-type universal remote control as claimed in claim 1, wherein the macro button is set to sequentially transmit remote control codes and a delay in inserted therebetween.

13. The intelligent touch-type universal remote control as claimed in claim 12, wherein the delay has a duration programmed by the user via the setting menu.

14. The intelligent touch-type universal remote control as claimed in claim 8, wherein the remote timer control capability is combined with the macro button to initiate a series of remote control operations when a setting time is reached.

* * * * *